United States Patent
Takeda et al.

(10) Patent No.: US 7,151,046 B2
(45) Date of Patent: Dec. 19, 2006

(54) SEMICONDUCTOR THIN FILM DECOMPOSING METHOD, DECOMPOSED SEMICONDUCTOR THIN FILM, DECOMPOSED SEMICONDUCTOR THIN FILM EVALUATION METHOD, THIN FILM TRANSISTOR MADE OF DECOMPOSED SEMICONDUCTOR THIN FILM, AND IMAGE DISPLAY DEVICE HAVING CIRCUIT CONSTITUTED OF THIN FILM TRANSISTORS

(75) Inventors: Kazuo Takeda, Tokorozawa (JP);
Takeshi Sato, Kokubunji (JP);
Masakazu Saito, Mobara (JP); Jun Gotoh, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 25 days.

(21) Appl. No.: 10/900,365

(22) Filed: Jul. 28, 2004

(65) Prior Publication Data
US 2005/0139830 A1    Jun. 30, 2005

(30) Foreign Application Priority Data
Oct. 24, 2003   (JP)   ............................. 2003-364539

(51) Int. Cl.
*H01L 21/20* (2006.01)
(52) U.S. Cl. ...................... 438/487; 438/795
(58) Field of Classification Search ............... 438/486, 438/487, 795
See application file for complete search history.

(56) References Cited

U.S. PATENT DOCUMENTS 5,756,364 A * 5/1998 Tanaka et al. ............... 438/30
6,706,570 B1 * 3/2004 Yamazaki et al. ........... 438/152
6,744,008 B1 * 6/2004 Kasahara et al. ............ 219/121.65
6,982,396 B1 * 1/2006 Yamazaki et al. ........... 219/121.8

FOREIGN PATENT DOCUMENTS

| JP | 64-076715 | 9/1987 |
| JP | 09-246183 | 3/1996 |
| JP | 10-064815 | 8/1996 |
| JP | 2002-313724 | 8/1996 |
| JP | 10-312963 | 5/1997 |
| JP | 11-274078 | 3/1998 |
| JP | 2000-011417 | 6/1998 |
| JP | 2000-353664 | 6/1999 |
| JP | 2003-109902 | 10/2001 |
| WO | WO 97/45827 | 5/1996 |
| WO | WO 01/71791 A1 | 3/2000 |

* cited by examiner

*Primary Examiner*—Sara Crane
(74) *Attorney, Agent, or Firm*—Reed Smith LLP; Stanley P. Fisher, Esq.; Juan Carlos A. Marquez, Esq.

(57) ABSTRACT

A surface roughness of a polycrystalline semiconductor film to be formed by a laser annealing method is reduced. A transmittance distribution filter is disposed at the optical system of a laser annealing apparatus. The transmittance distribution filter controls an irradiation light intensity distribution along a scanning direction of a substrate formed with an amorphous silicon semiconductor thin film to have a distribution having an energy part equal to or higher than a fine crystal threshold on a high energy light intensity side and an energy part for melting and combining only a surface layer. This transmittance distribution filter is applied to an excimer laser annealing method, a phase shift stripe method or an SLS method respectively using a general line beam to thereby reduce the height of protrusions on a polycrystalline surface.

9 Claims, 19 Drawing Sheets

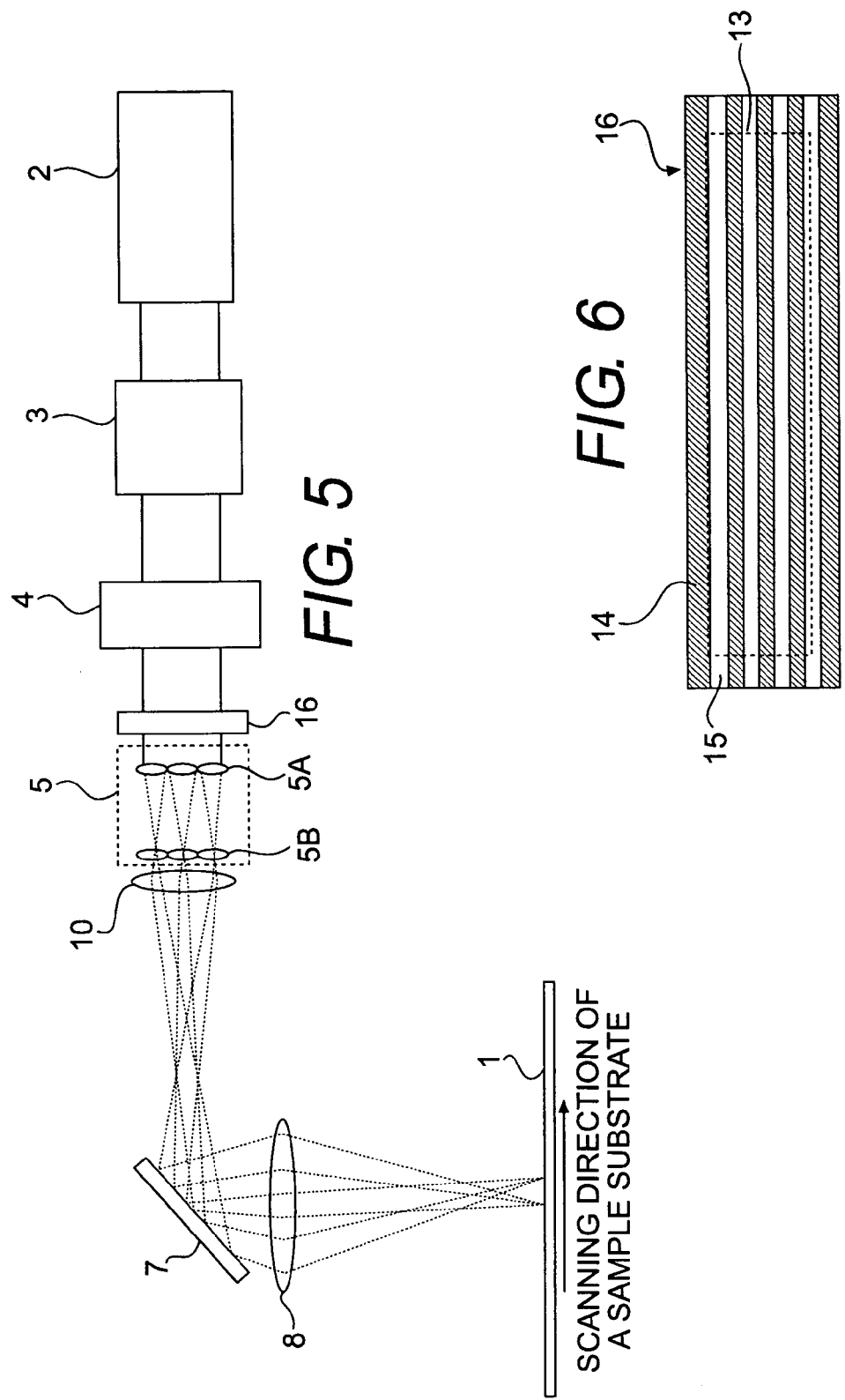

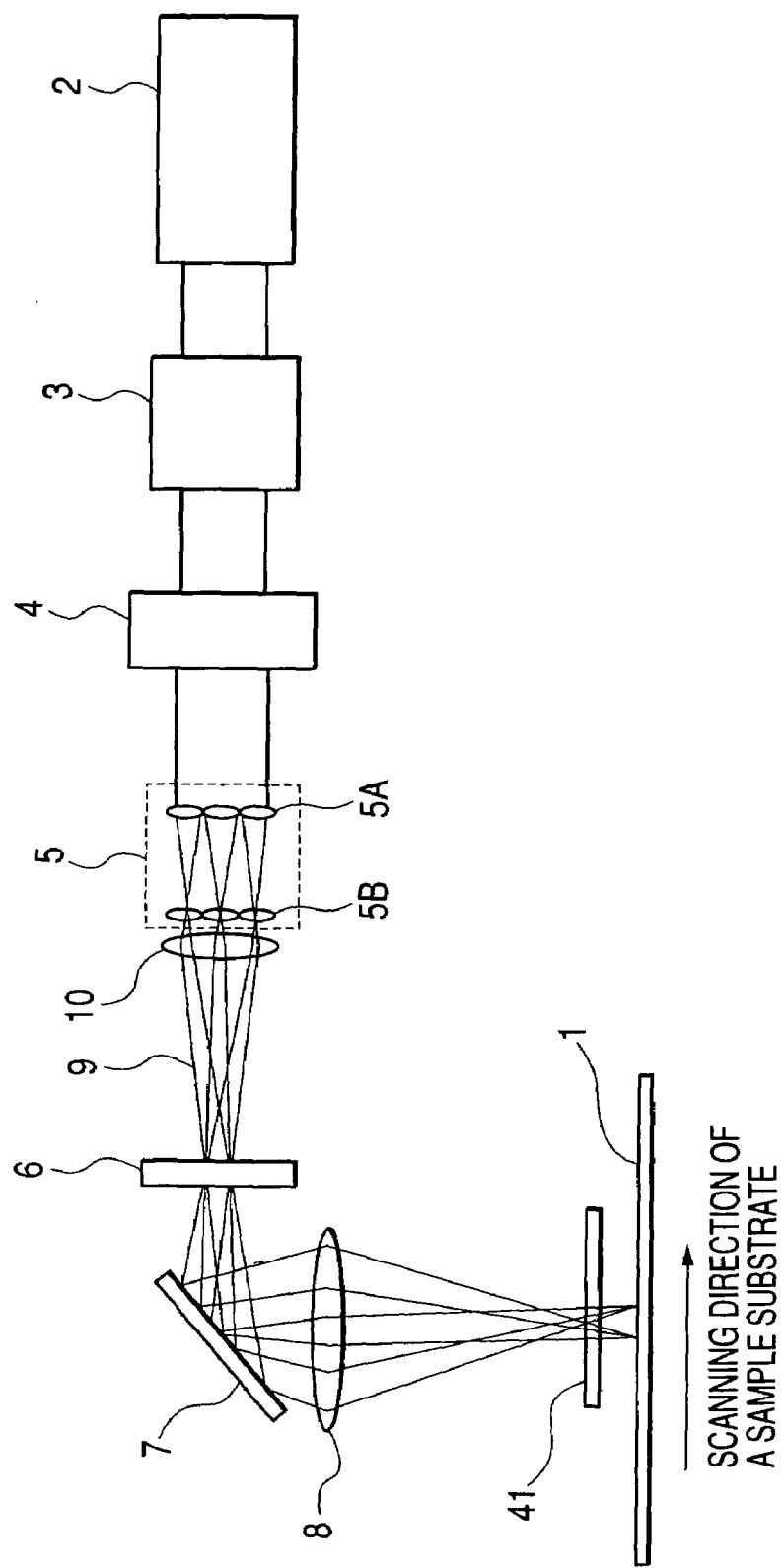

AVERAGE GRAIN SIZE L

AVERAGE GRAIN SIZE L

PROTRUDING PORTIONS AT CRYSTAL GRAIN BOUNDARIES — Po

PROTRUDING PORTIONS IN CRYSTAL GRAINS — Pi

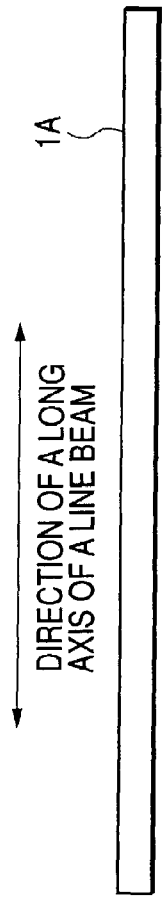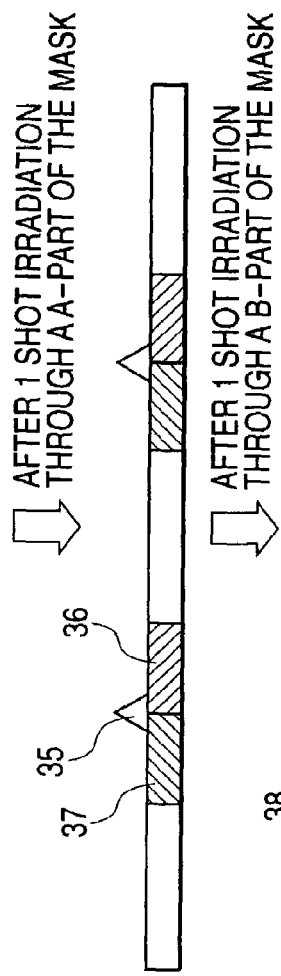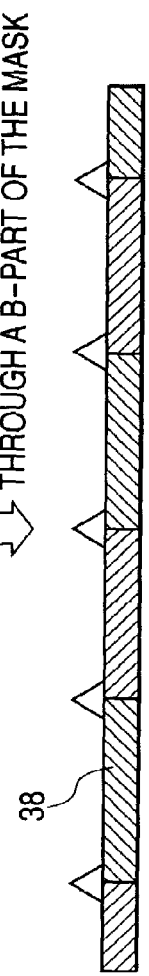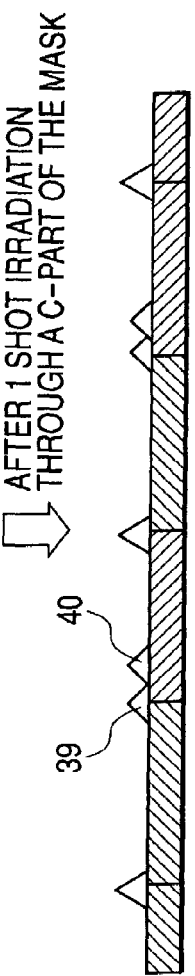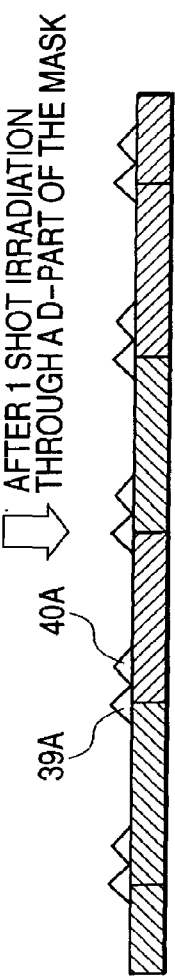
FIG. 15A
FIG. 15B
FIG. 15C
FIG. 15D
FIG. 15E POLY-Si FILM    DIFFRACTION PLANE $p = L * \tan(\arcsin((m\lambda)/d))$

OPTICAL DIFFRACTION PATTERN

DIRECTION OF A LONG AXIS OF A CRYSTAL GRAIN

SEMICONDUCTOR THIN FILM DECOMPOSING METHOD, DECOMPOSED SEMICONDUCTOR THIN FILM, DECOMPOSED SEMICONDUCTOR THIN FILM EVALUATION METHOD, THIN FILM TRANSISTOR MADE OF DECOMPOSED SEMICONDUCTOR THIN FILM, AND IMAGE DISPLAY DEVICE HAVING CIRCUIT CONSTITUTED OF THIN FILM TRANSISTORS

The present application claims priority from Japanese application JP2003-364539 filed on Oct. 24, 2003, the content of which is hereby incorporated by reference into this application.

BACKGROUND OF THE INVENTION

1. Field of the Invention

The present invention relates to a semiconductor thin film decomposing method of decomposing an amorphous semiconductor thin film into a polycrystalline semiconductor thin film, a decomposed semiconductor thin film evaluation method, a thin film transistor made of a decomposed semiconductor thin film, and a semiconductor device including a flat panel type image display device having a circuit constituted of thin film transistors.

2. Description of the Related Art

A flat panel type image display device such as a liquid crystal display device has a pixel circuit and a drive circuit fabricated in a semiconductor thin film formed on an insulating substrate (hereinafter, also called simply a substrate), preferably a glass substrate. Thin film transistors (TFT) are often used in the pixel circuit and drive elements constituting the drive circuit. In place of an amorphous semiconductor thin film (typically, an amorphous silicon semiconductor thin film, or also called an a-Si film), a polycrystalline semiconductor thin film (typically a polysilicon semiconductor thin film, or also called a poly-Si film) has been used recently as the active layer of a thin film transistor so that an image of high definition and high quality can be displayed.

A semiconductor thin film used as the active layer of a thin film transistor will be described by taking a silicon semiconductor thin film by way of example. More excellent characteristics can be obtained by using a polycrystalline silicon semiconductor thin film as an active layer, than by using an amorphous silicon semiconductor thin film. One of the reasons for this may be ascribed to that a polycrystalline silicon semiconductor thin film has a higher mobility of carriers (electrons in an n-channel and holes in a p-channel) than that of an amorphous silicon semiconductor thin film. The cell size (pixel size) can therefore be reduced so that high definition is possible. Furthermore, a high temperature process at 1000° C. or higher is required to form a thin film transistor made of a general polysilicon semiconductor thin film. According to low temperature polysilicon semiconductor thin film forming techniques using annealing of only a silicon layer by a laser beam without heating a substrate supporting a semiconductor thin film to a high temperature, a thin film transistor (TFT) having a high mobility can be formed at a low temperature process, which allows an inexpensive glass substrate to be used.

Since the mobility generally becomes larger the larger the size of a crystal grain of a polysilicon semiconductor thin film is, a variety of technologies have been proposed for a method of forming a polysilicon semiconductor thin film having a large grain size. According to a general method, as described in JP-A-64-76715, a pulse laser beam shaped in a line beam having a trapezoidal intensity distribution profile is repetitively irradiated on an amorphous silicon semiconductor thin film, by shifting the line beam at a pitch of about 1/20 of a short axis width of the line beam in the unit of one shot. The amorphous silicon semiconductor thin film absorbs the irradiated laser beam so that the thin film raises its temperature and is melted to then lower the temperature. With this process, the silicon semiconductor thin film is crystallized so that the amorphous silicon semiconductor thin film is changed to a polysilicon semiconductor thin film (this phenomenon is called decomposition). The average grain size of a polysilicon semiconductor thin film changes with the energy density of an irradiated laser beam. At the energy density necessary for crystallizing an amorphous silicon semiconductor thin film or a lower energy density, the grain size becomes larger as the energy density is increased. However, at a certain threshold value, fine crystals having an average grain size of 100 nm or larger can be formed. It is therefore necessary that irradiation is performed at an energy density lower than the fine crystal threshold value.

In contrast with this, JP-A-9-246183 discloses a method of forming a large grain size at a skirt portion of an intensity distribution profile. This pulse laser irradiation area intensity distribution profile has a trapezoidal shape and a maximum intensity larger than the threshold value at which an amorphous silicon semiconductor thin film changes to a fine polysilicon semiconductor thin film.

The above-described techniques correspond to an average grain size of 1 µm. For example, if an amorphous silicon semiconductor thin film having a thickness of 50 nm is changed to a polysilicon semiconductor thin film, a margin of the laser energy density for obtaining a grain size of 0.3 µm or larger is about 10% of which about a half has a PV value of a protrusion of 70 nm or larger. The PV value is defined as a difference between the maximum and minimum values in a measurement range.

Another method of forming a large grain size of a silicon semiconductor thin film is a method of controlling an optical intensity distribution. One of these conventional techniques is a method called a sequential lateral solidification method (SLS method) as disclosed in Publication No. WO97/45827. According to this method, a laser beam intensity distribution in an in-plane direction is divided into a plurality of beam pieces having a micrometer size to form a temperature gradient in the in-plane direction and forcibly promote crystal growth in the lateral direction. With this method, protrusions are formed on the surfaces of boundaries where the directions of crystal growths of a plurality of crystal grains are collide with each other.

The position where the protrusion is formed corresponds to the light intensity peak position of each beam piece. The reason for this is that since this position has the highest temperature, crystallization progresses from both sides of the peak position toward the peak position and the crystal growths collide with each other at the peak position. This protrusion is higher than that of a polysilicon semiconductor thin film formed by irradiation of a laser beam shaped in the above-described trapezoidal profile, and this protrusion has the PV value of 100 nm or larger in some cases.

Methods proposed in JP-A-10-64815 and JP-A-2002-313724 are improved techniques of a method disclosed in JP-A-9-246183. According to this method, a laser beam is first irradiated at a high energy, and thereafter, crystallization is performed under an intensity distribution control of irradiation of a laser beam at an energy lower than the first high energy to form large crystal grains. It is described that this intensity distribution control method can obtain an asymmetrical intensity distribution by changing the positions of a focal point and a substrate surface. However, the cause and effect of the ability of obtaining the asymmetrical distribution shape is not disclosed. In contrast, JP-A-10-312963 describes that the trapezoidal shape is changed to an inverted bell shape by changing the positions of a focal point and a substrate surface, which contradicts the results described in JP-A-10-64815. Although JP-A-2000-11417 also describes that a similar irradiation distribution can obtain crystals having a large grain size, it does not describe a laser beam forming method.

The above-described conventional techniques use a pulse laser beam. The crystallization method for a silicon semiconductor thin film by such a pulse laser, i.e., the decomposition method, forms a polysilicon semiconductor thin film having a very large surface irregularity because protrusions are formed on the thin film after crystallization. It is therefore necessary to form a thick gate insulating film when, for example, a thin film transistor is to be fabricated on a polysilicon semiconductor thin film. There arises the problem that a transistor on-current reduces in inverse proportion with the thickness of a gate insulating film.

As an improved method of reducing protrusions of a polysilicon semiconductor thin film formed through irradiation of a laser line beam having a trapezoidal profile, JP-A-2000-353664 discloses a method of reducing protrusions by executing laser annealing at different energy densities a plurality of times. The contents disclosed in JP-A-2000-353664 are as follows. Namely, hydrogen contained in an amorphous silicon semiconductor thin film when it is formed is abruptly emitted during laser annealing and the film surface becomes rough. The film surface roughness can be prevented by emitting hydrogen before crystal annealing by irradiating a laser beam having a low energy density at a crystallization threshold value or lower.

As a protrusion reducing method by the SLS method, Publication No. WO01/71791 discloses a protrusion reducing method by which crystallization annealing is performed through laser beam irradiation and thereafter, the second laser beam irradiation is performed at 25% to 75% of the energy density realizing a perfect melting state.

The above-described methods have the following disadvantages. Namely, one disadvantage is a long time of an annealing process because a laser beam is irradiated at a plurality of stages and required to scan a substrate a plurality of times. Another disadvantage is irregular protrusion reduction effects on a substrate surface when a pulse laser is repetitively irradiated at a plurality of energy densities each for a different irradiation time to superpose each irradiated pulse laser beam, because the scanning speed is required to be changed to change the irradiation time because of a constant repetition period of the pulse laser beam.

Even if a polysilicon semiconductor thin film is formed by a method having effective protrusion reduction, a whole substrate surface roughness satisfying the management standards cannot be obtained unless some other process is incorporated, because there are a fluctuation of a laser output with time and an in-plane variation of an amorphous semiconductor thin film before crystallization. For example, this process inspects protrusions after crystallization, detects a high protrusion area or large surface roughness area, and re-crystallizes this area. A well-known technique of measuring the surface roughness is an evaluation method using an interatomic force microscope. However, this method takes at least about several minutes to evaluate even a fine area of 10 μm×10 μm so that it is unpractical to evaluate the surface roughness of a whole substrate.

As a method of evaluating a surface roughness at high speed, JP-A-11-274078 discloses an evaluation method using a surface glossiness (reflectance). This method is associated with the disadvantage that since the roughness is evaluated by a reflectance, there is interference caused by a thickness of a polysilicon semiconductor thin film and a thickness of a film between a glass substrate and thin film. As a method of evaluating at high speed an in-plane distribution of grain sizes of a polysilicon semiconductor thin film, JP-A-2003-109902 discloses a method of measuring a grain size by a spread with of an angular distribution of scattered light.

SUMMARY OF THE INVENTION

The method of irradiating a laser beam at a plurality of energy densities to an amorphous silicon semiconductor thin film in order to reduce protrusions to be formed on a surface of a polysilicon semiconductor thin film formed by crystallizing the amorphous silicon semiconductor thin film has the disadvantage of a long crystallizing process time because a large number of scanning times at each energy density of an irradiated laser beam. It also has the disadvantage that the protrusion reduction effect by a plurality of superposed scans at a different scanning pitch becomes irregular on a substrate (on a semiconductor thin film formed on a substrate such as a glass substrate, this being applicable in the following description). These disadvantages will be described with reference to the accompanying drawings.

FIG. 22 is a diagram illustrating a change in a laser beam irradiation energy with time. Eth in the ordinate of FIG. 22 represents a lower threshold value of crystallization. FIG. 23 is a diagram illustrating a side effect which occurs when a plurality of laser beams are scanned in accordance with a change with time shown in FIG. 22. Solid lines represent a scanning pitch at a laser beam irradiation energy of E1, and broken lines represent a scanning pitch at a laser beam irradiation energy of E2. It is assumed as shown in FIG. 22 that a laser beam is irradiated by scanning the whole substrate under the conditions that the same area of a substrate is irradiated first by a laser beam at the energy density of E1 for a time T1 and second by a laser beam at the energy density of E2 for a time T2. Since the pulse laser repetition frequency is constant, the first scanning pitch is a value ($\propto 1/T1$) proportional to 1/T1 and the second scanning pitch is a value ($\propto 1/T2$) proportional to 1/T2. When a superposition of the scanning pitches of two types is considered, the superposition on the substrate becomes irregular like patches, as shown in FIG. 23. This influence results in average protrusion heights distributed in an in-plane like patches.

It is therefore a first object of the present invention to provide a semiconductor thin film manufacturing method and apparatus using a protrusion reduction method capable of preventing formation of periodical high protrusion areas and a laser annealing method realizing the protrusion reduction method. A second object of the present invention is to provide a semiconductor thin film manufactured by the manufacturing method of the present invention.

Even crystallization is performed by a method providing a larger grain size and reducing protrusions, the grain size and protrusion height do not always satisfy the management standards because there are a fluctuation of a laser output with time and an in-plane variation of an amorphous semiconductor thin film thickness. It is therefore a third object of the present invention to provide an evaluation method and apparatus for evaluating the characteristics of a semiconductor thin film manufactured by using a method capable of measuring all grain sizes and protrusion heights on the whole substrate surface.

It is a fourth object of the present invention to provide a thin film transistor made of a semiconductor thin film of the present invention. It is a fifth object of the present invention to provide an image display device having circuits constituted of thin film transistors.

According to a semiconductor thin film manufacture method of the present invention, if an amorphous silicon semiconductor thin film is to be changed to a polysilicon semiconductor thin film through melting and coagulation by laser beam irradiation, i.e., by a so-called laser annealing method, the annealing is performed at a plurality of energy stages in order to reduce the surface roughness of the polycrystallized silicon semiconductor thin film. This annealing method is characterized mainly in that a transmittance distribution filter with a controlled laser beam transmittance in-plane distribution is disposed in an illumination optical system to shape the laser beam to a line beam having a long axis direction along a direction perpendicular to the scanning direction, and that irradiation at a plurality of energy densities along the scanning direction is performed by one scan by controlling the light intensity distribution along the short axis direction of the line beam corresponding to the scanning direction of the laser beam shaped to the line beam.

The features of a semiconductor thin film decomposing method and a decomposed semiconductor thin film evaluating method of this invention will be described with reference to the accompanying drawings which are also used when the embodiments will be later described. It is explicitly said that the following description and the description of the embodiments to be later given have some duplicated portions. FIG. 1 shows a laser annealing optical system for realizing the semiconductor thin film manufacture method of the present invention. In the laser annealing optical system shown in FIG. 1, a uniform intensity of a line beam distribution is formed by a short axis homogenizer 5 and a long axis homogenizer 4. The short axis homogenizer 5 is constituted of a pair of confronting cylindrical lens arrays 5A and 5B. A laser beam from a laser source 2 is incident upon the short axis homogenizer 5 after transmitting through an attenuator 3 and the long axis homogenizer 4. The attenuator 3 adjusts the laser beam emitted from the laser source 2 to have a predetermined energy.

A lens 10 mounted after the short axis homogenizer 5 superposes laser beams 9 transmitted through respective lenses of the cylindrical lens arrays 5A and 5B in the short axis homogenizer 5 upon a first order focussing plane. A light intensity distribution in the respective lenses of the first stage cylindrical lens array 5A of the short axis homogenizer 5 is projected upon the first order focussing plane. The light intensity distribution becomes more uniform as each lens of the cylindrical lens array 5A becomes smaller and the number of lenses becomes large.

A filter (transmittance distribution filter) 6 formed with an in-plane transmittance distribution is placed at the first order focussing plane. The transmittance distribution filter 6 is made of transparent quartz. As shown in FIG. 2, the surface of the transmittance distribution filter 6 is subjected to reflectance coating so that the in-plane transmittance distribution can be controlled at a precision of ±0.5%. The detailed structure of the transmittance distribution filter 6 will be described later in DESCRIPTION OF THE EMBODIMENTS. The light intensity distribution on the first order focussing plane is controlled at the precision of ±0.5% of the filter transmittance distribution. A laser beam having this light intensity distribution is reduced and projected upon the surface of a substrate 1 formed with a semiconductor thin film, by a mirror 7 and a lens 8. The above-described short axis distribution control method is herein called a first order focussing plane control method.

Next, another method of controlling an intensity distribution in the short axis direction will be described with reference to FIGS. 5 and 6. According to the other method of controlling an intensity distribution in the short axis direction, a transmittance distribution filter 16 at the front stage of the short axis homogenizer 5 controls the light intensity distribution in the respective lenses of the cylindrical lens array 5A constituting the short axis homogenizer 5 to thereby control the synthesized distribution shape. As shown in FIG. 5, the transmittance distribution filter 16 is placed in front of the short axis homogenizer 5. As shown in FIG. 6, the transmittance distribution filter 16 has stripe-shaped reflectance control coating films with the transmittance distribution corresponding to the cylindrical lens array 5A to control the light intensity distribution of respective lenses in the short axis direction. The light intensity distribution shape on the surface of a substrate 1 is the shape of superposed intensity distributions of respective lenses. FIG. 6 shows the stripes corresponding to three lenses. This method is called herein an intra-homogenizer distribution control method. The detailed description of the transmittance distribution filter 16 will be described later in DESCRIPTION OF THE EMBODIMENTS.

The above-described short axis distribution control methods of two types are improvements on an optical system and a crystallization method of the laser annealing system for shaping a laser beam into a line beam. These methods may be applied also to the other annealing method using a laser beam different from the line beam. In the following, description will be made on an application method of the present invention to the SLS method disclosed in JP-A-64-76715.

As shown in FIG. 13, a general SLS crystallizing system is constituted of a light source 2, an attenuator 3, a homogenizer 25, a lens 29, a mask 26, an imaging lens 27, and a movable stage 30 placed on which is a substrate 1 formed with an amorphous silicon semiconductor thin film. Mirrors 23 and 24 are disposed between the attenuator 3 and homogenizer 25 and a mirror 28 is disposed between the imaging lens 27 and movable stage 30, to reflect an incident laser beam by a predetermined angle and change the direction of the laser beam. The homogenizer 25 is an optical system for shaping a laser beam and making uniform the light intensity in the shaped laser beam. A combination of the homogenizer 25 and lens 29 forms a uniform intensity distribution in a laser beam at the position of the mask 26.

The position of the mask 26 corresponds to the first order focussing plane of the optical system shown in FIG. 1. The mask 26 forms a bright/dark pattern of a light intensity on the surface of the substrate 1 to form a temperature gradient in the in-plane direction, enhance crystal growth in a lateral direction (a direction perpendicular to the scanning direction, or a width direction), and form crystals of a large grain size. As will be described with reference to FIG. 14, a transmittance in-plane distribution control filter, i.e., transmittance distribution filter 31 of the present invention is disposed near the mask 26 to control the light intensity of a laser beam transmitting through each pattern of the mask.

FIG. 14 shows an example of a combination of a mask pattern and a filter transmittance pattern. An opening of the mask, i.e., a slit 26A, has its long axis along the scanning direction of the substrate 1. The structure of the mask pattern is as follows. Namely, in A- and B-parts, the phase of a layout period of the slits 26A is shifted by a half period in the scanning direction, and in C- and D-parts, similarly the phase is shifted by a half period. In the A- and C-parts, the phase is shifted by an amount different from a half period, for example, by a quarter period. The reason for this setting is to relatively displace the positions of protrusions formed by projection of patterns in the A- and B-parts when an amorphous silicon semiconductor thin film is decomposed to a polysilicon semiconductor thin film, from the positions of protrusions formed by projection of patterns in the C- and D-parts.

The transmittance distribution filter 31 corresponding to the mask 26 has a transmittance difference of 10% or more between a part 32 formed with an antireflection film and a part 33 formed with a reflection film. The transmittance distribution filter 31 is installed near the mask 26. The installation position may be either an upstream or downstream side of the mask 26. The scanning pitch is adjusted relative to the repetition frequency of a pulse laser so that one shot of a pulse laser beam is irradiated to each part of the mask pattern. An irradiation procedure during one scan will be described with reference to FIGS. 15A to 15E. One shot irradiation through the pattern in the A-part is applied to an amorphous silicon film 1A formed on a substrate shown in FIG. 15A, leaving the areas not irradiated. These areas not irradiated correspond to the areas in the part A not masked and correspond to the areas not crystallized.

As shown in FIG. 15B, in the crystallized A-part, two laterally grown crystal grains 36 and 37 exist on both sides of a boundary with a protrusion 35. A next one shot irradiation at the same energy density is applied through the pattern in the B-part (FIG. 15C). With this shot, in the areas not crystallized by the preceding shot, crystals are grown from opposite side crystals as seeds toward the center. Therefore, a polysilicon semiconductor thin film is formed which has a distance between protrusions equal to the average grain boundary size. Thereafter, one shot laser beam irradiation is performed for the pattern in the C-part as shown in FIG. 15D and for the pattern in the D-part as shown in FIG. 15E, respectively at the energy density lower by 10% or more.

In this case, irradiation is executed at the energy density lower by 10% or more so that the positions of protrusions are different. A laser beam at this energy density cannot melt the whole thickness of the silicon semiconductor thin film and only the surface layer thereof is melted. Therefore, a grain boundary is not formed but only protrusions are formed on the surface layer of the silicon semiconductor thin film. As a result, as shown in FIG. 15D, low protrusions 40 are formed at positions different from the grain boundary positions. The height of the high protrusions 39 formed after the irradiation through the pattern in the B-part is lowered because the silicon semiconductor thin film is displaced due to the formation of the low protrusions. As described above, the feature of the present invention resides in that the SLS method using energy densities can be performed by one scan to reduce the protrusions.

There is a method of promoting lateral crystal growth, different from the SLS method. As described in Japanese Patent Laid-open Publication No. 2002-284735, the SLS method uses a mask having a periodical slit pattern, whereas according to the crystallization method using the phase shift mask, as shown in FIG. 8 a mask (phase shift stripe mask) 41 having a phase shift stripe pattern is disposed near an amorphous silicon film 1A formed on a substrate, and the irradiation intensity of a laser beam is modulated on a silicon film surface to form laterally grown crystals on the substrate whole surface during scanning. This technique is not necessary to use a lens between a mask and a specimen like the SLS method, and is advantageous in that it can be applied to a line beam having a length of several hundred mm. In the following, description will be made on a method of reducing protrusions by applying the transmittance in-plane distribution filter of the present invention to the phase shift stripe method.

FIG. 8 illustrates the relation between a silicon crystal grain growth direction and a light intensity distribution, when a pulse laser beam transmits through a phase shift stripe mask 41 disposed just above a substrate and is irradiated on an amorphous silicon film 1A formed on the substrate. A period of a stripe pattern of the phase shift stripe mask 41 is about 3 μm. One shot irradiation forms crystal grains laterally grown on the whole irradiation surface. Similar to the SLS method, the crystal growth direction is a direction from a low laser beam intensity to a high laser beam intensity. Therefore, protrusions 42 are formed at positions corresponding to the laser beam intensity peaks.

FIG. 7 shows an optical system of a crystallization apparatus when the transmittance distribution filter is applied to the phase shift stripe method. It is possible to use a general excimer laser annealing system using a line beam. The position of the transmission distribution filter 6 of the present invention is the same as that shown in FIGS. 1 and 5. FIG. 7 shows the apparatus structure that a filter 6 is disposed at the position same as that shown in FIG. 1. A phase shift stripe mask 41 is disposed just above a substrate 1. FIG. 9 is a diagram showing an irradiation part as viewed from the substrate 1 and illustrating the relation among a scanning direction of the substrate 1, a pattern direction of the phase shift stripe mask 41 and a line beam 50. The stripe pattern of the phase shift stripe mask 41 has some constant angle relative to the scanning direction of the substrate 1. The reason for this is as follows. Namely, a relative shift amount between the phase shift stripe and the substrate 1 is set within one period of the stripe pattern in the scanning direction and in the period of laser pulse repetition, and is also made to change at each shot.

The transmittance distribution filter 6 sets the intensity distribution of the line beam 50 in the short axis direction so that the energy density in an M-part shown in FIGS. 10A to 10D becomes lower than that in an N-part by 10% or more. One shot irradiation through the pattern in the M-part to an amorphous silicon film 1A formed on a substrate shown in FIG. 10A forms crystal grains laterally grown in the whole irradiation area. The average crystal grain size is about a half of the protrusion pitch. By repeating irradiation through the pattern in the M-part, the melting phenomenon is repeated over the whole polycrystalline film thickness so that the average grain size along the growth direction becomes equal to the protrusion pitch (FIG. 10B). Protrusions 35 formed by the last shot are higher, and the positions of the protrusions correspond to the grain boundaries. Protrusions 40 formed by the preceding shot remain lower (FIG. 10C). Irradiation through the pattern in the N-part has a low melting energy so that grain boundaries cannot be formed but only low protrusions can be formed. When these low protrusions are formed, the height of the higher protrusions 35 formed by the last shot through the pattern in the M-part lowers because of a surface layer silicon flow during the formation of protrusions by irradiation through the pattern in the N-part (FIG. 10D).

Even if crystallization is performed by the above-described protrusion reducing method, there are a fluctuation of a laser output with time and an in-plane variation of a thickness of an amorphous silicon semiconductor thin film before crystallization. However, inspection (surface roughness evaluation) is performed after crystallization, and if an area having high protrusions is detected, this area is re-crystallized so that the height of protrusions on the whole substrate surface can satisfy the management standards.

Next, as described in the conventional techniques, description will be made on a surface roughness evaluation method which does not influenced by interference by a thickness of a polysilicon semiconductor thin film. The surface roughness evaluation method of the present invention measures a transmittance and a reflectance of a polysilicon semiconductor thin film and calculates "total scattering cross sectional area+absorption cross sectional area" from "1−(reflectance+transmittance)" to evaluate a surface roughness. With this method, the interference can be cancelled out by a sum of a reflectance and a transmittance. Namely, since the transmittance reduces by an amount corresponding to an increase in the reflectance caused by the interference, a sum of a reflectance and a transmittance does not influenced by interference. As this measurement is applied to an amorphous silicon semiconductor thin film, since the surface roughness is small, the scattering cross sectional area can be neglected so that it is possible to evaluate a thickness of an amorphous silicon semiconductor thin film from the absorption cross sectional area.

It can be considered that a polysilicon semiconductor thin film, a single crystal silicon semiconductor thin film and a thin film which can neglect the multiple absorption effect by multiple scattering have the same absorption cross sectional area. The absorption cross sectional area of a polysilicon semiconductor thin film is dependent upon an average film thickness and a wavelength. A film thickness distribution variation is about ±5% for a large substrate of one square meter, which can be considered constant. The total scattering cross sectional area has a portion dependent upon a grain size and a portion dependent upon a surface roughness. A combination of this fact and a grain size evaluation method can measure a surface roughness. Namely, the present invention adopts a surface roughness evaluation method which measures two types of quantities, a grain size obtained by grain size evaluation and "total scattering cross sectional area+absorption cross sectional area".

Another method of evaluating a protrusion height will be described. This method is suitable for a method of evaluating a pitch of protrusions and their heights of a polysilicon semiconductor thin film formed by the SLS Method or phase shift stripe mask method. This method evaluates the protrusion height from an intensity of a diffraction spot of a light diffraction pattern formed by a protrusion. Namely, this evaluation method judges that the protrusion is high if the intensity of a diffraction spot is strong.

According to the present invention, a high mobility thin film transistor is manufactured by using a polysilicon semiconductor thin film manufactured by the above-described decomposition method, and a high definition image display device is formed by using such thin film transistors.

According to the semiconductor thin film decomposition method of the present invention, laser beam irradiation at a plurality of energy densities can be realized by one scan. Further, the protrusion reduction effect by laser beam irradiation at a plurality of energy densities during a plurality of scans can reduce random protrusions on a substrate surface due to a difference of a pulse duration in each scan so that there is no area having a surface roughness at a PV value of 70 nm or more. Even if the surface roughness becomes 70 nm or more because of some reason, all protrusions on the whole surface are inspected to detect an area at 70 nm or more. This detected area is re-crystallized to lower the protrusion height so that the protrusion can be set lower than 70 nm. A TFT using a polysilicon film having a protrusion at 70 nm can use a gate insulating film having a thickness of 110 nm or thinner in order to prevent dielectric breakdown defects, if a generally used tetraethylorthosilicate (TEOS) film is used.

A thin film transistor of the present invention has a high mobility. In an image display device using such thin film transistors, thin film transistors in a drive circuit and a pixel circuit can be speeded up and can be made very fine so that an image quality can be improved.

Other objects, features and advantages of the invention will become apparent from the following description of the embodiments of the invention taken in conjunction with the accompanying drawings.

BRIEF DESCRIPTION OF THE DRAWINGS

FIG. 5 is a schematic diagram illustrating another example of the optical system of the laser annealing apparatus realizing a semiconductor manufacture method of the present invention.

FIG. 6 is a schematic diagram showing an example of the structure of a transmittance distribution filter shown in FIG. 5.

FIG. 7 is a schematic diagram illustrating still another example of the optical system of the laser annealing apparatus realizing a semiconductor manufacture method of the present invention.

FIGS. 15A to 15E are diagrams illustrating the crystallization of a silicon semiconductor thin film obtained by the SLS method using a transmittance distribution filter.

DESCRIPTION OF THE EMBODIMENTS

According to the present invention, a light intensity distribution in a cross section of a laser beam along the scanning direction can be made to have a plurality of stages, by using a filter having a transmittance in-plane distribution. It is therefore possible that one laser annealing scan can realize a method of reducing protrusions by irradiation of a laser beam at a plurality stage of irradiation energy densities. Description will be made on embodiments of a manufacture method and embodiments of protrusion evaluation.

First Embodiment

Figure 1:
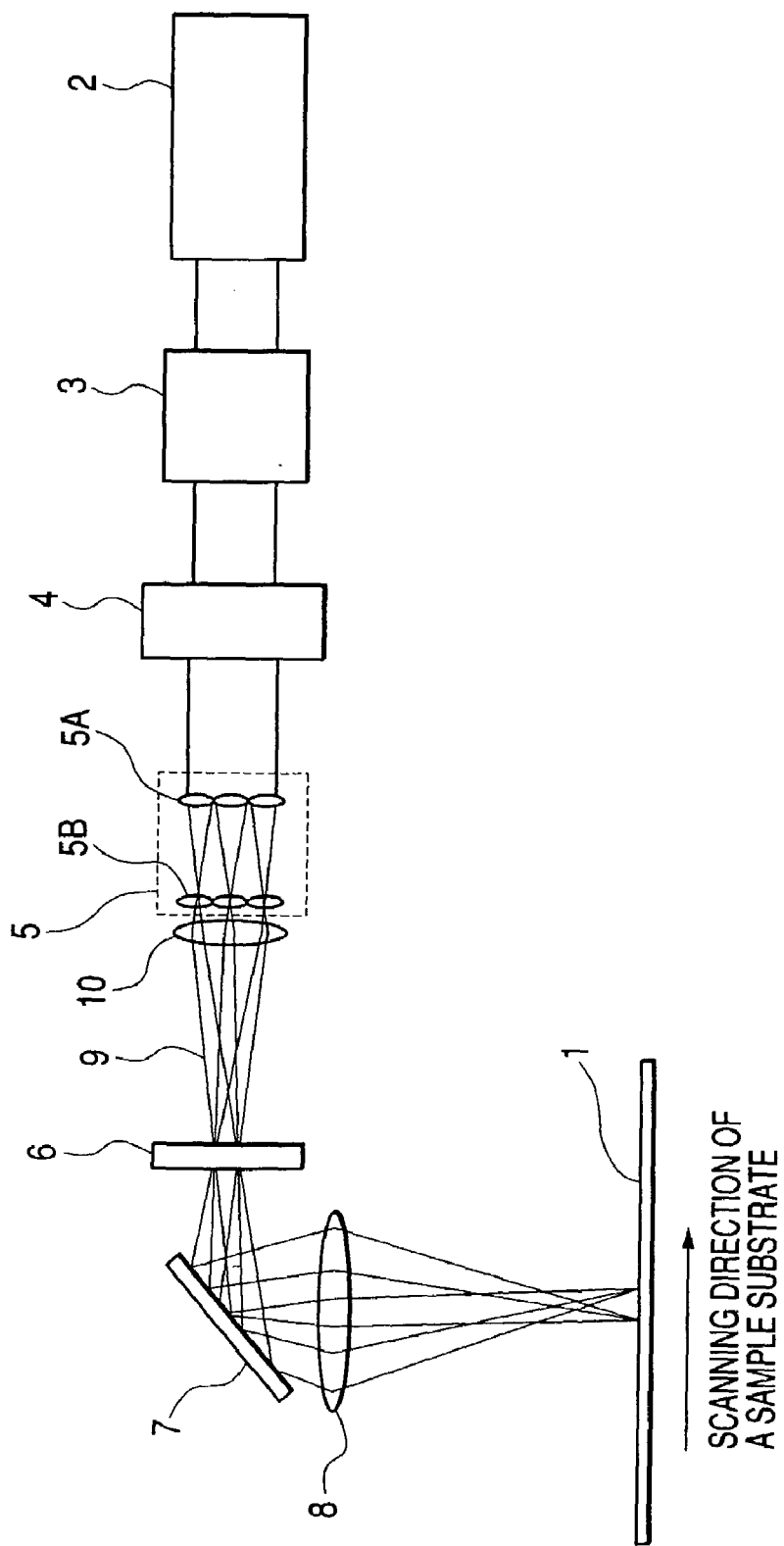
FIG. 1 is a schematic diagram illustrating an example of an optical system of a laser annealing apparatus realizing a semiconductor manufacture method of the present invention.

FIG. 1 is a schematic diagram showing an example of an optical system of a laser annealing apparatus realizing a semiconductor decomposition method of the present invention. In this embodiment, a transmittance distribution control filter of the present invention is applied to an excimer laser annealing apparatus used generally. Referring to FIG. 1, a laser source 2 is a STEEL1000 type XeCl excimer laser source manufactured by Lambda Physik. The wavelength of an output laser beam is 308 nm, a pulse time duration is about 27 ns, a repetition frequency is 300 Hz and a pulse energy is 1 J/pulse. This laser annealing apparatus was manufactured by Japan Steel Works, Ltd. A laser beam shaped to a line beam having a long axis length of 365 mm and a short axis length of 400 μm is irradiated to a substrate, by using a long axis homogenizer optical system 4 and a short axis homogenizer optical system 5 manufactured by MicroLas and a cylindrical lens 10, a cylindrical lens 8 and a mirror 7. In order to control the light intensity distribution of a laser beam to be irradiated to the substrate 1, a transmittance distribution filter 6 is disposed at a first order focussing plane. As will be described with reference to FIG. 2, the transmission distribution of the transmittance distribution filter 6 is controlled by a transmittance controlled surface coating on a quartz plate.

Figure 2:
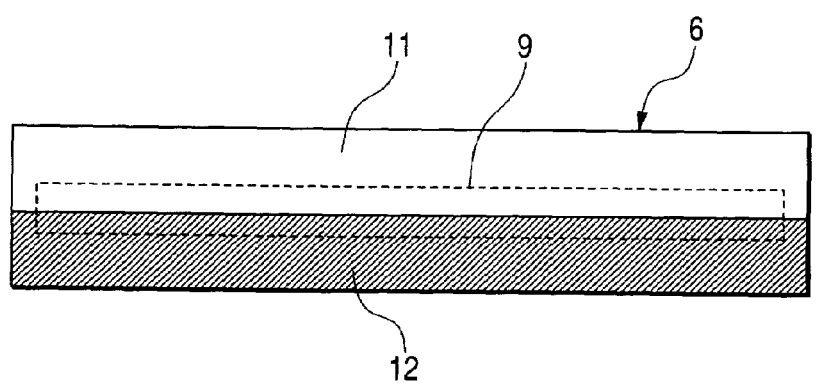
FIG. 2 is a schematic diagram showing an example of the structure of a transmittance distribution filter shown in FIG. 1.

FIG. 2 is a schematic diagram showing an example of the structure of the transmittance distribution filter 6 shown in FIG. 1. A part 11 of the transmittance distribution filter 6 has a transmittance higher than that of a part 12. Specifically, the surface of the part 11 is coated at a reflectance of 1%, and the surface of the part 12 is coated at a reflectance of 11%. The whole back surface is coated at a reflectance of 1% so that a transmittance of the part 11 is 98% and that of the part 12 is 88%.

Figure 3:
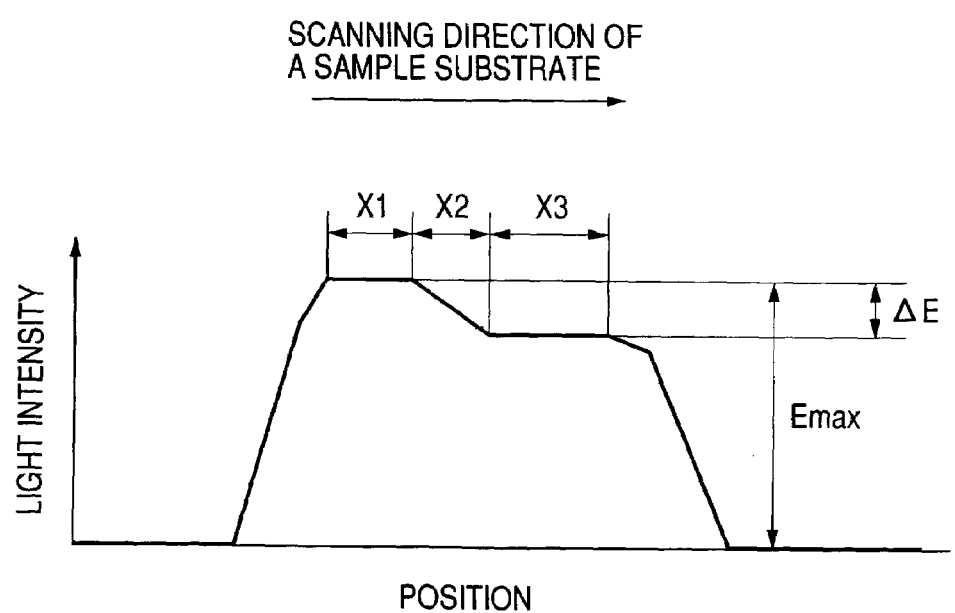
FIG. 3 is a diagram illustrating a light intensity distribution along a short axis direction obtained by the transmittance distribution filter shown in FIG. 1.

FIG. 3 is an illustrative diagram showing a light intensity distribution in the short axis direction obtained by the transmission distribution filter 6 shown in FIG. 1. The maximum irradiation energy intensity in an X1-part of the distribution shown in FIG. 3 is adjusted by a variable attenuator 3 and its lower limit is set to the threshold value at which an amorphous silicon semiconductor thin film formed on the substrate 1 changes to fine crystals on the high energy irradiation density side, or to a value higher than the threshold value. An adjustment upper limit is set by the transmittance distribution filter so that the energy density at a last X3-part, the energy density at which at least a surface layer is melted, has a value ΔE of 0.1 Emax. In this case, fine crystals in the X1-part on the high energy side are melted and combined by energy density irradiation in an X2-part to have a large grain size, and only the surface layer is melted in the X3-part to reduce protrusions.

Experiments were conducted by using a filter having a transmittance difference of 13% between the parts 11 and 12 shown in FIG. 2. An irradiation margin for an average grain size of 0.5 μm was 12% when the widths of the X1- and X3-parts were fixed to the same value, and the heights of protrusions were all 70 nm or lower in the range of 80% to 99% which the attenuator transmittance covers the above-described margin.

Figure 4A:
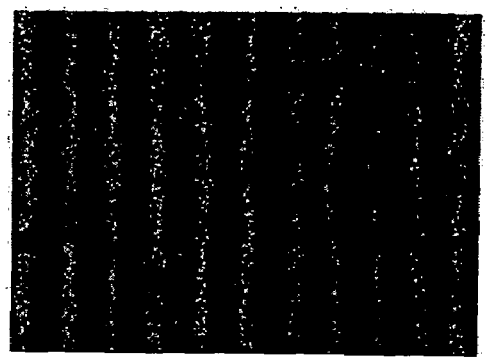
FIG. 4 is a sketch of dark field optical microscopic photographs of silicon semiconductor crystals formed by a plurality of scans of a laser beam at different irradiation energy densities without using a transmittance distribution filter.
Figure 4B:
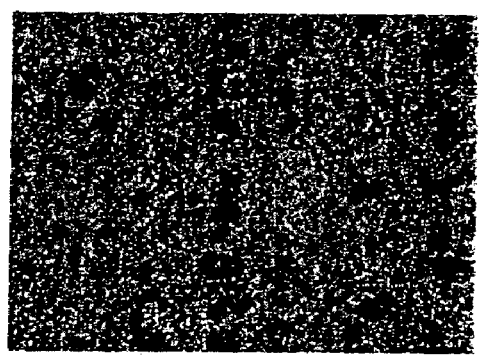

FIG. 4 shows the sketche of dark field optical microscopic photographs of silicon semiconductor crystals when a laser beam was irradiated a plurality of scans at different irradiation energy densities without using the transmittance distribution filter. In this case, two scans are performed by changing the attenuator transmittance to form crystals. A scan pitch of the first crystallization was 24 μm and that of the second crystallization was 14 μm. The sketch shown in (a) of FIG. 4 was obtained under the conditions that the attenuator transmittance was set to 94% for the first crystallization, and for the second crystallization, set to the value lower by 6% than that of the first crystallization. Under these conditions, the second irradiation energy density is also over the threshold value of fine crystals on the high energy side so that a fine crystal part is formed and fine crystal stripes can be observed at a pitch of 14 µm. Since the distribution skirt portion has a low energy density, fine crystals are partially melted and combined and are observed as whitish parts in (a) of FIG. 4.

The sketch shown in (b) of FIG. 4 was obtained under the conditions that the attenuator transmittance was set to 88% for the first crystallization, and for the second crystallization, set to the value lower by 6% than that of the first crystallization. A blackish part in the sketch corresponds to fine crystals by the first irradiation on the high energy density side and has a pitch of 24 µm corresponding to the first irradiation pitch, the fine crystals being melted and combined by the second irradiation at a low energy density to have a larger grain size.

As above, if a laser beam is irradiated a plurality stage of scans at different energy densities without using the transmittance distribution filter, specimens of a silicon semiconductor thin film have different scan pitch shapes depending upon the energy densities. In contrast, when the transmittance distribution filter is used, only one scan pitch appears on a specimen. In this embodiment, the scan pitch is determined by a scan speed and is equal to a motion amount corresponding to 1/300 second which is obtained from the repetition frequency of the laser source 2.

Second Embodiment

Next, with reference to FIGS. 5 and 6, the second embodiment will be described. FIG. 5 is a schematic diagram showing another example of the optical system of the laser annealing apparatus realizing the semiconductor manufacture method of the present invention. FIG. 6 is a schematic diagram showing an example of the structure of a transmittance distribution filter 6 shown in FIG. 5. This embodiment has fundamentally the same structure constituted of the laser source 2 and laser annealing apparatus of the first embodiment described with reference to FIG. 1. Different points of the second embodiment from the first embodiment reside in that the transmittance distribution filter 16 is disposed just in front of a short axis homogenizer 5 and that the transmittance distribution of the transmittance distribution filter 16 has a shape of stripes so as to control the intensity distribution in respective lenses of the cylindrical lens array in the short axis homogenizer 5 as shown in FIG. 6. In FIG. 6, the cylindrical lens array 5A of the short axis homogenizer 5 is drawn as having five lenses, and an incidence laser beam is drawn as having a width corresponding to three lenses as surrounded by broken lines 13. Similar to the first embodiment, the number of actual lenses is nine, and the part surrounded by the broken lines 13, i.e., the laser transmission area, has a width corresponding to lenses of nine or smaller.

Referring to FIG. 6, each part surrounded by the broken lines 13 (three parts in FIG. 6) is a part via which light transmits through the lens, and the intensity distribution of each part is controlled by stripe parts of two types, i.e., parts 14 and 15 having different transmittances. Since the irradiation beam intensity distribution on the surface of a substrate specimen is a synthesis of intensity distributions in the lens array 5A of the short axis homogenizer 5, the transmittance distribution filter 16 controls the stepwise intensity distribution by a transmittance difference between the parts 14 and 15.

Third Embodiment

In this embodiment, the transmittance distribution filter is applied to the crystallization method using a phase shift stripe mask. FIG. 7 is a schematic diagram showing another example of the optical system of the leaser annealing apparatus using the phase shift stripe method realizing the semiconductor manufacture method of the present invention. This embodiment uses a general excimer laser annealing apparatus using a line beam of the above-described first and second embodiments. The position of the transmittance distribution filter 6 may be the same as that shown in FIG. 1 or 5. In FIG. 7, the position of the transmittance distribution filter is the same as that shown in FIG. 1. In this embodiment, a phase stripe mask 41 is disposed near a substrate 1. The mask may be disposed on the first order focussing plane.

Figure 8:
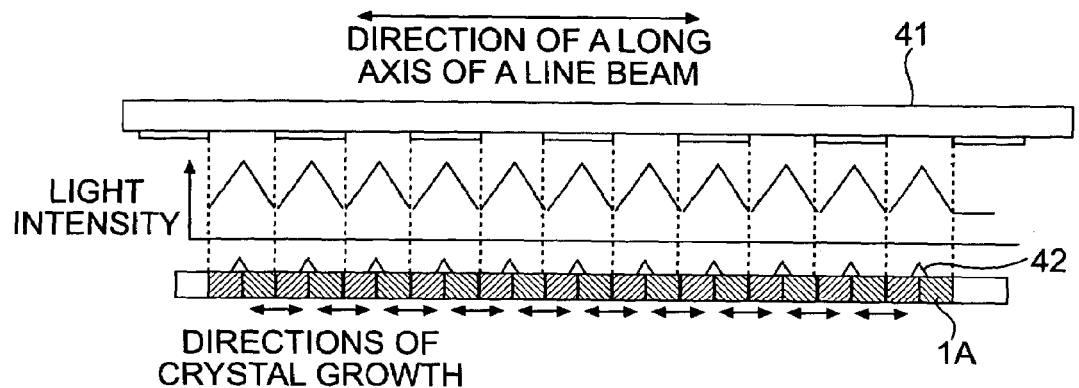
FIG. 8 is a diagram illustrating a method of crystallizing a silicon semiconductor thin film by using a phase shift stripe mask.

FIG. 8 is a diagram illustrating a method of crystallizing a silicon semiconductor thin film by using a phase shift stripe mask. As shown in FIG. 8, the phase shift stripe mask 41 has concave and convex stripe patterns formed on a quartz plate at a pitch of 3 µm and shifting the phase by nearly 180° at a wavelength of 308 nm. The stripe patterns are formed along a direction generally perpendicular to the long axis direction of a line-shaped laser beam. The phase shift stripe mask is disposed spaced by 0.9 mm from the surface of an amorphous semiconductor film 1A formed on the substrate. Other structures are similar to those shown in FIG. 1. Since a pulse excimer laser beam has light at various phases due to the homogenizer optical system, the intensity distribution of a laser beam after passing through the phase shift mask having a phase shift of 180° is not 0 at the valley. Therefore, if the minimum intensity is set to the crystallization threshold or higher, one shot irradiation does not leave amorphous silicon.

FIG. 8 shows the relation between a light intensity distribution and a crystal growth of a specimen when a pulse laser beam transmits through the phase shift stripe mask 41 disposed just above the amorphous silicon film 1A formed on the substrate and is irradiated to the amorphous silicon thin film 1A on the substrate. The period of the stripe patterns of the phase shift stripe mask 41 is about 3 µm. As shown, in this embodiment, one shot via the lens can form crystal grains grown laterally in the whole irradiation part. Similar to the SLS method, the crystal growth direction is along a direction from the lower laser beam intensity to the higher laser beam intensity, and protrusions 42 are formed at peak positions of the laser beam intensity.

Figure 9:
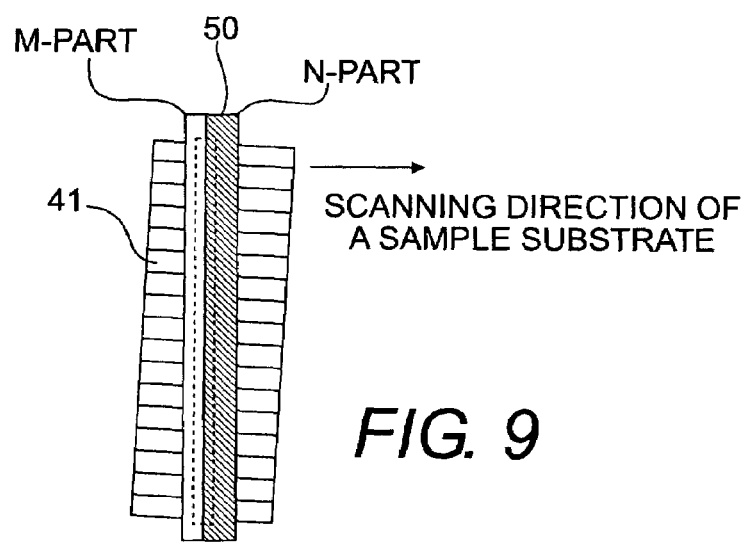
FIG. 9 is a diagram illustrating the pattern of a transmittance distribution filter and the pattern of a phase shift stripe mask and a substrate scanning direction.
Figure 25:
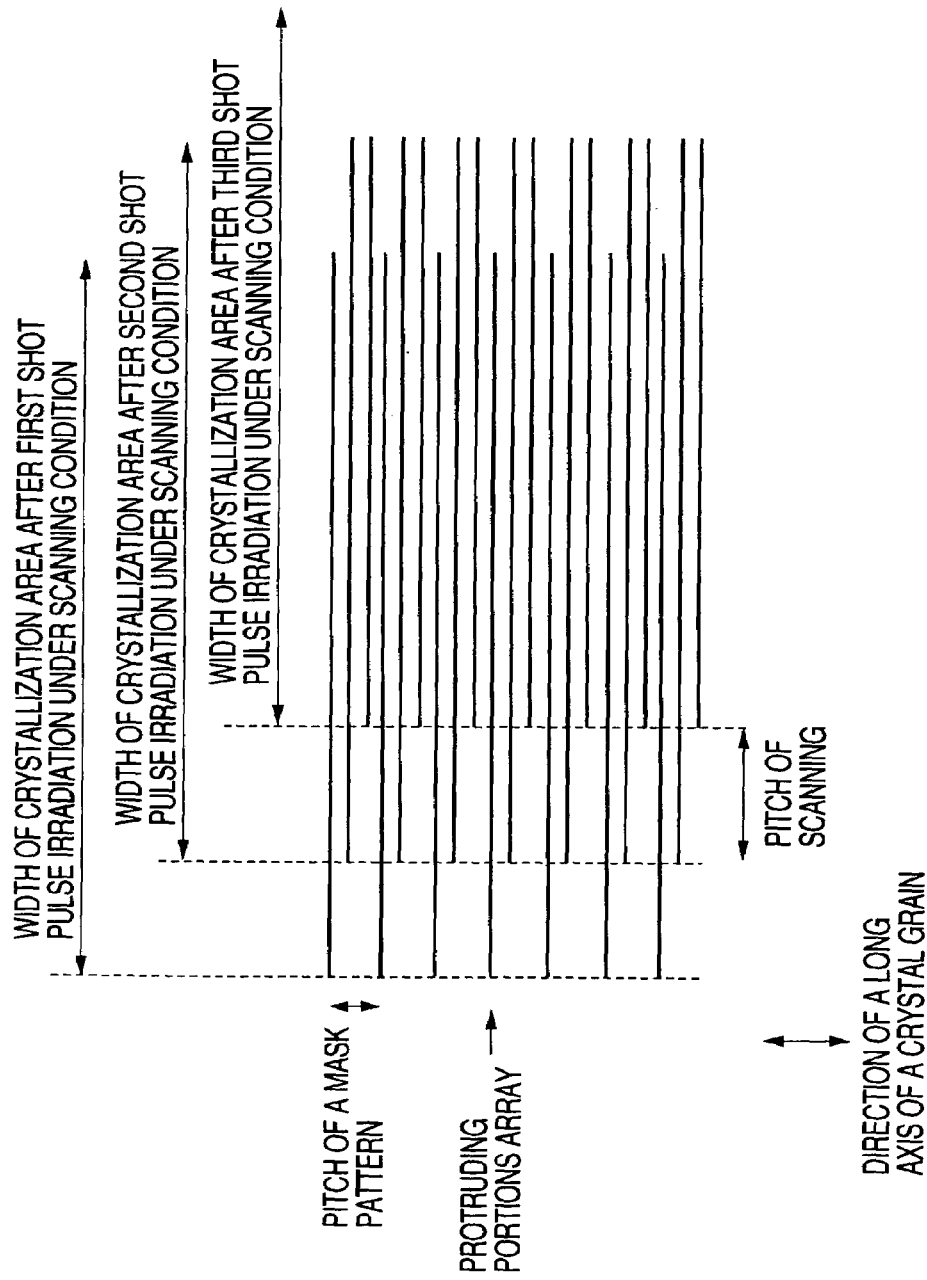
FIG. 25 shows the relation between the annealing scan pitch and the period of changing the layout positions of protrusions on the surface of a polycrystalline film formed by the phase shift stripe mask method.

FIG. 9 is an illustrative diagram showing the pattern of the transmittance distribution filter, the pattern of the phase shift stripe mask and the substrate scanning direction, and FIG. 9 shows a laser beam irradiation part viewed from the substrate 1. An angle between the phase shift stripe pattern and substrate scanning direction was set to 1 degree and the scanning speed was set to 7.2 mm/sec. In this case, a motion pitch between pulses is about 24 µm. A relative shift amount between the phase shift stripe pattern and substrate 1 between pulses is about 0.5µ in one period of the stripe patterns in the scanning direction. The layout positions of protrusions formed at each shot are displaced by this amount. FIG. 25 shows the relation between the scanning pitch and the period of changing the layout positions of protrusions. A crystallized part by one shot is displaced by a scanning pitch. At this time, the layout positions of protrusions are also displaced. Therefore, the period of changing the layout positions of protrusions is equal to the scanning pitch. The crystal growth direction is the mask pattern pitch direction which is generally perpendicular to the scanning direction.

As shown in FIG. 9, the transmittance distribution filter is disposed in parallel to a line beam indicated by a broken line, the boundary between M- and N-parts having different transmittances being set in the line beam. The transmittance distribution filter is made of quartz. A surface of the M-part is coated at a reflectance of 1%, the surface of the N-part is coated at a reflectance of 11% or higher, and the whole back surface is coated at a reflectance of 1%. Therefore, an energy density difference between the M- and N-parts is 10% or larger.

Figure 10A:
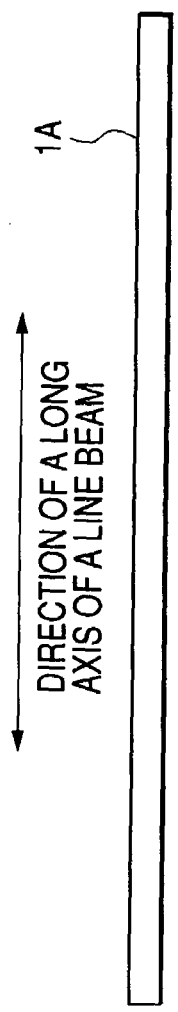
FIGS. 10A to 10D are diagrams illustrating the crystallization of a silicon semiconductor thin film using a transmittance distribution filter and a phase shift stripe mask.
Figure 10B:
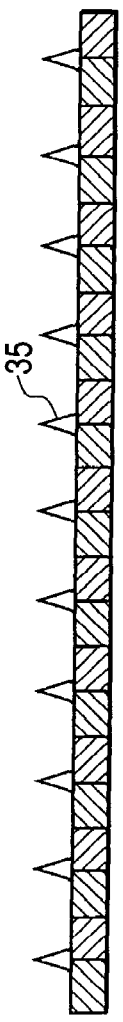
Figure 10C:
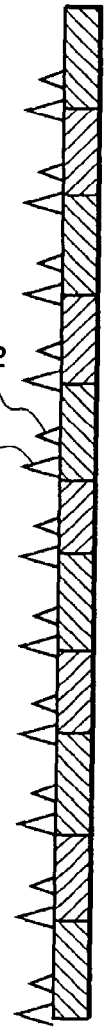

FIGS. 10A to 10D are diagrams illustrating crystallization of a silicon semiconductor thin film when the transmittance distribution filter and phase shift stripe mask are used. With the above-described arrangement, one shot irradiation through the pattern in the M-part to an amorphous silicon film 1A formed on a substrate shown in FIG. 10A forms crystal grains laterally grown in the whole irradiation area. The average crystal grain size is about a half of the protrusion pitch (FIG. 10B). By repeating irradiation through the pattern in the M-part, the melting phenomenon is repeated over the whole polycrystalline film thickness so that the average grain size along the growth direction becomes equal to the protrusion pitch (FIG. 10C). Protrusions 35 formed by the last shot are higher, and the positions of the protrusions correspond to the grain boundaries. Protrusions 40 formed by the preceding shot remain lower in many cases. Irradiation through the pattern in the N-part has a low melting energy so that grain boundaries cannot be formed but only low protrusions can be formed.

Figure 10D:

When these low protrusions are formed, the height of the higher protrusions 35 formed by the last shot through the pattern in the M-part lowers because of a surface layer silicon flow during the formation of protrusions by irradiation through the pattern in the N-area (FIG. 10D). FIG. 10D schematically shows the silicon semiconductor thin film on the substrate crystallized at the transmittance 90% of the attenuator 3. Crystals have the protrusions at the crystal grain boundaries and the protrusions in the crystal grains.

Since the period of the layout positions of protrusions is determined by one shot scanning pitch, a polycrystalline film having protrusions of one type at the period of about 24 μm can be obtained.

Figure 11A:
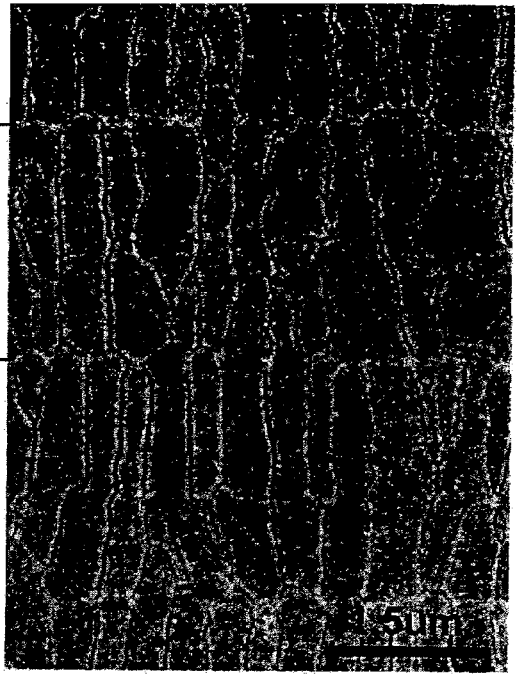
FIGS. 11A and 11B are sketches of silicon semiconductor crystals observed with a scanning electron microscope (SEM) when a transmittance distribution filter is applied and not applied to a shape shift stripe mask method.
Figure 11B:
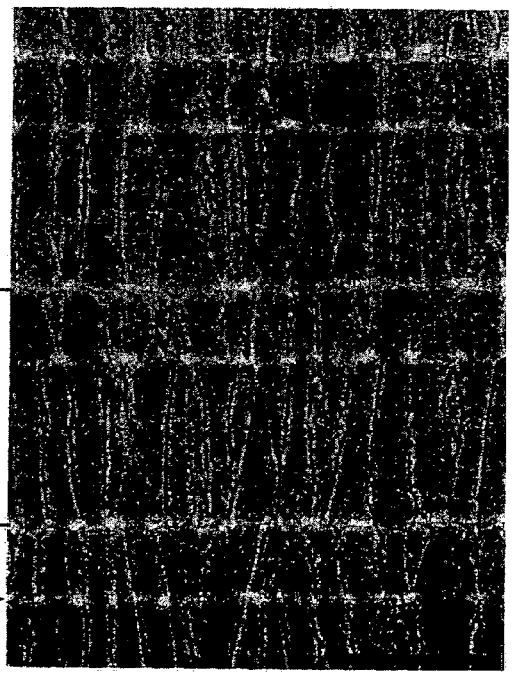

FIGS. 11A and 11B are sketches of silicon semiconductor crystals observed with a scanning electron microscope (SEM), when the transmittance distribution filter is applied and not applied to the phase shift stripe mask method.

FIG. 11A is a sketch of a SEM photograph of crystals crystallized by using the transmittance distribution filter, and FIG. 11B is a sketch of a SEM photograph of crystals crystallized without using the transmittance distribution filter. A whitish part observed in the sketches shown in FIGS. 11A and 11B corresponds to a protrusion formed on the surface. Reference character L in FIGS. 11A and 11B represents an average grain size, Po in FIG. 11B represents the position where protrusions are disposed mainly at the crystal grain boundaries, and Pi represents the position where protrusions are mainly disposed in the crystal grains.

When the transmittance distribution filter is not used as shown in FIG. 11B, it can be known that higher protrusions observed whitish are formed in crystal grains. When the transmittance distribution filter is used as shown in FIG. 11A, since protrusions are lower, higher protrusions observed whitish with a SEM photograph are not observed. In this case, the PV value of protrusions was 70 nm or lower.

Figure 12:
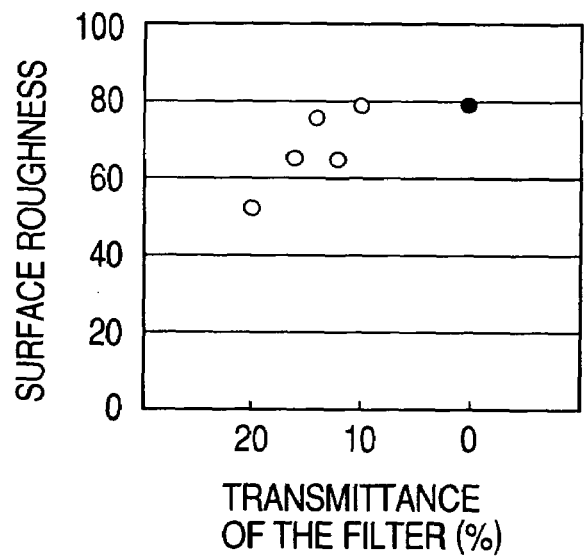
FIG. 12 is a diagram illustrating the relation between a protrusion height and a transmittance difference of a transmittance distribution filter when the transmittance distribution filter is applied to the phase shift stripe mask method.

FIG. 12 is an illustrative diagram showing the relation between a protrusion height and a transmittance difference of the transmittance distribution filter when the transmittance distribution filter is applied to the phase shift stripe mask method. FIG. 12 is the graph showing the evaluation results of protrusion heights in a 10 μm square part observed with an interatomic force microscope, relative to a transmittance difference between the M- and N-parts of the transmittance distribution filter shown in FIG. 9. It can be known from the results shown in FIG. 12 that the protrusion reduction effects appear at the transmittance difference of 10% or larger and that at the difference of 15% or larger, the PV value is 70 nm or smaller.

Since the pitch of the phase shift stripe patterns is 3 μm, crystals grow to the size of a half of the pitch so that the crystal grain size in the growth direction is about 1.5 μm. The grain boundary size in the crystal growth direction and in the direction perpendicular to the crystal growth direction is 0.5 μm or smaller. Annealing scans along perpendicular two directions may be performed to obtain an average grain size of 1.5 μm along both the directions.

Fourth Embodiment

Figure 13:
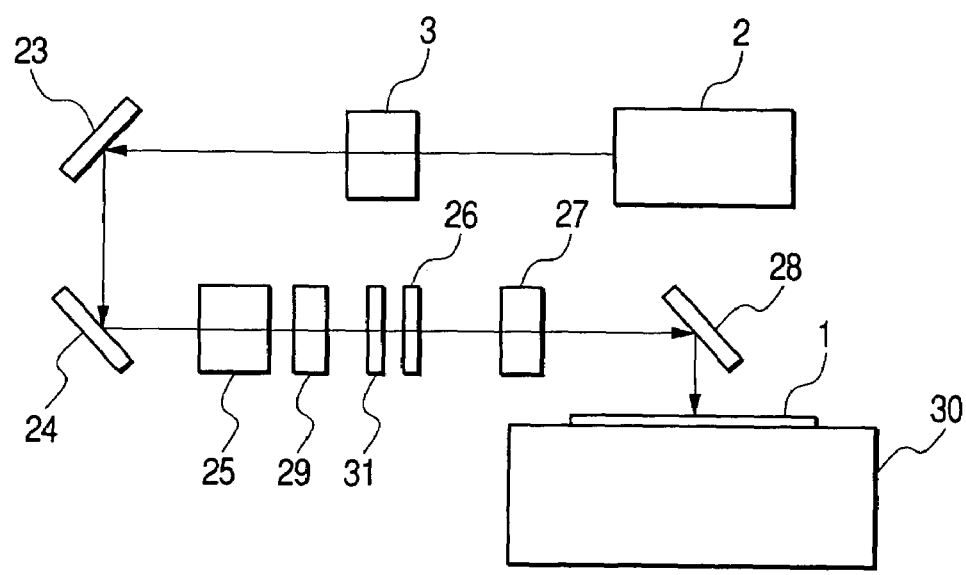
FIG. 13 is a schematic diagram showing the optical system of a laser annealing apparatus with the transmittance distribution control filter being applied to an SLS method.
Figure 14:
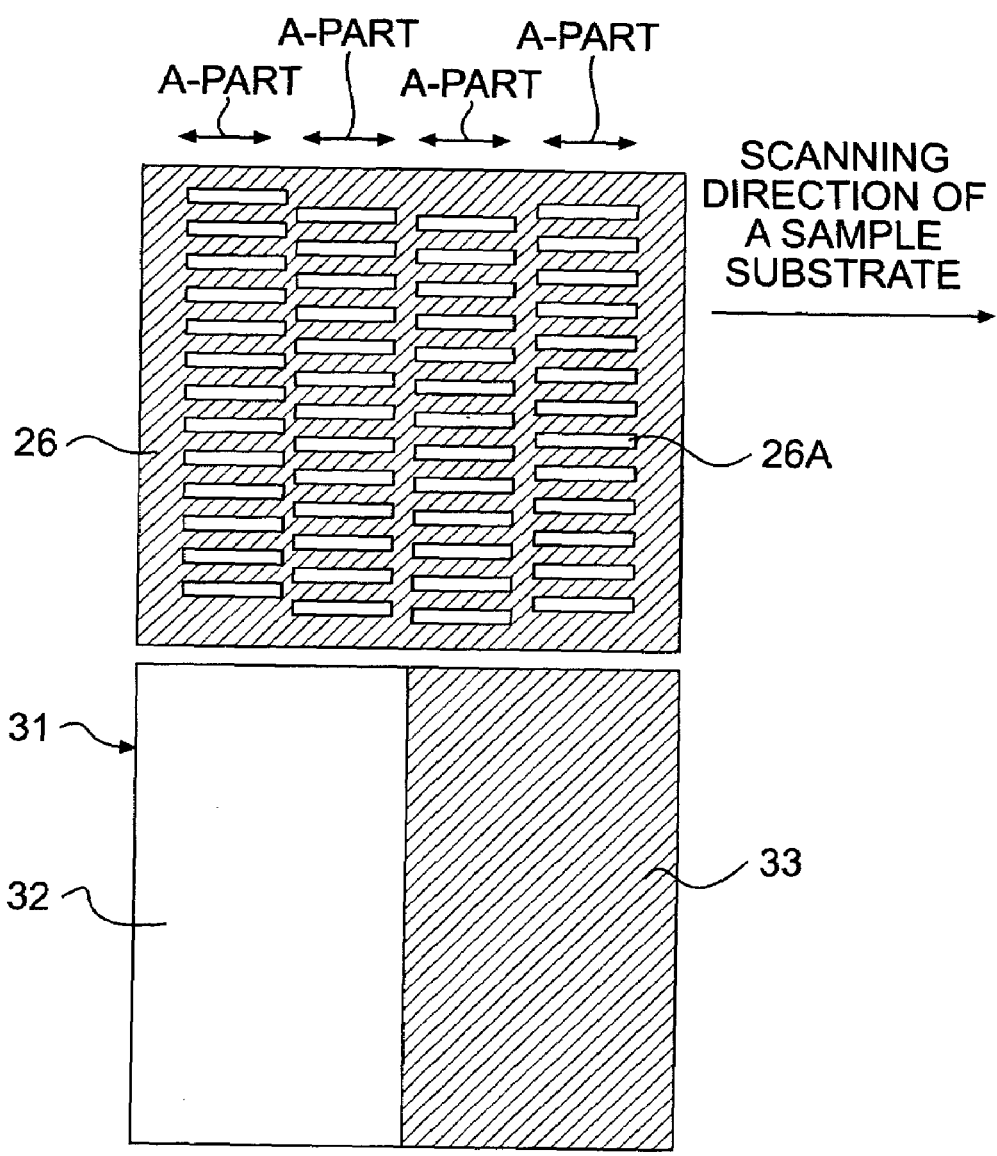
FIG. 14 is a diagram showing an example of a transmittance distribution control filter applied to the laser annealing apparatus using an SLS method.

In this embodiment, the transmittance distribution control filter is applied to the SLS method. FIG. 13 is a schematic diagram illustrating the optical system of the laser annealing apparatus applying the transmittance distribution control filter to the SLS method. FIG. 14 is a diagram showing an example of a transmittance distribution control filter applied to the laser annealing apparatus using the SLS method. As shown in FIG. 13, the laser annealing apparatus for the SLS method (SLS crystallizing apparatus) has a laser light source 2 having the same structure as that of the first embodiment. Sequentially disposed at the later stages of the laser source 2 are an attenuator 3, a homogenizer 25, a lens 29, a mask 26, an imaging lens 27, and a movable stage 30 placed on which is a substrate 1 formed with an amorphous silicon semiconductor thin film. A transmission distribution control filter 31 of the present invention is disposed between the lens 29 and mask 26. Mirrors 23 and 24 are disposed between the attenuator 3 and homogenizer 25 and a mirror 28 is disposed between the imaging lens 27 and movable stage 30, to reflect an incident laser beam by a predetermined angle and change the direction of the laser beam.

The homogenizer 25 is an optical system for shaping a laser beam and making uniform the light intensity in the shaped laser beam. A combination of the homogenizer 25 and lens 29 forms a uniform intensity distribution in a laser beam at the position of the mask 26. The mask 26 shown in FIG. 14 is made of aluminum. A mask opening or slit 26A has a width of 15 μm, and the mask between slits 26A has also a width of 15 μm. In A- and B-parts, the phase of a layout period of the slits 26A is shifted by 15 μm relative to the substrate scanning direction. In C- and D-parts, similarly the phase is shifted by 15 μm. In the A- and C-parts, the phase is shifted by an amount different from 15 μm.

A mask pattern is projected by the lens 27 onto a specimen surface at a reduction ratio of 1/5. A bright/dark intensity distribution is therefore formed on the substrate at a period of 6 μm and at a width of 3 μm. The size of the mask 26 is 50 mm×50 mm. The width of each of the A-, B-, C- and D-parts on the mask 26 is 10 mm.

The transmittance distribution filter 31 shown in FIG. 14 had the same size as that of the mask 26. On the surface of a quartz substrate, a part 32 formed with a coating film at a reflectance of 1% and a part 33 formed with a coating film at a reflectance of 16% were formed, and on the whole back surface a coating film at a reflectance of 1% was formed. The filter having a transmittance difference of 15% between the parts 32 and 33 was disposed near the mask on the immediate upstream side. In order to irradiate only one shot on each part of the mask pattern, the scan moving amount for ⅟₃₀₀ sec of the pulse interval is set so as to be coincide with the interval of the parts of the pattern on the specimen.

FIGS. 15A to 15D are diagrams illustrating crystallization of a silicon semiconductor thin film obtained by the SLS method using the transmission distribution filter. Under the above-described conditions, an amorphous silicon thin film 1A on the substrate surface shown in FIG. 15A is subjected to laser annealing process in the order of the A-part irradiation (FIG. 15B), B-part irradiation (FIG. 15C), C-part irradiation (FIG. 15D) and D-part irradiation (FIG. 15E). As shown in FIG. 15E, the crystallized silicon semiconductor thin film has protrusions 39A at the grain boundary positions and protrusions 40 in crystal grains. All heights of the protrusions were 70 nm or lower.

The size along the crystal growth direction was 3 µm. The grain boundaries in the growth direction and its perpendicular direction was 0.5 µm similar to the third embodiment. Annealing scans along generally perpendicular directions may be performed to have the grain boundary size of 3 µm along both directions.

Fifth Embodiment

Figure 16:
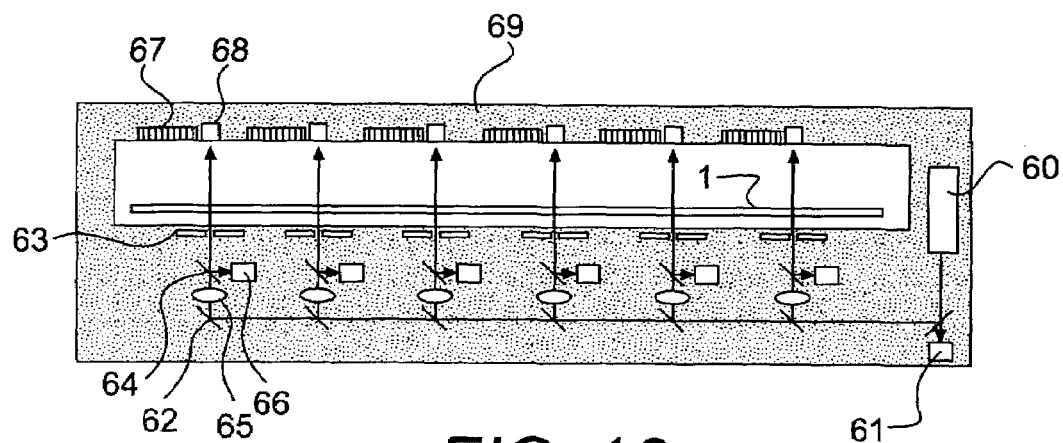
FIG. 16 is a schematic diagram showing an optical system of a grain size evaluation apparatus realizing a grain size evaluation method, with a surface roughness evaluation function being added to the grain size evaluation apparatus.

Next, description will be made on a roughness evaluation method for a polysilicon semiconductor thin film according to the embodiment of the present invention. FIG. 16 is a schematic diagram showing an optical system of a grain size evaluation apparatus realizing the grain size evaluation method of the present invention, with a surface roughness evaluation function being added to a grain size evaluation apparatus. The fundamental structure of this apparatus is similar to that disclosed in Japanese Patent Laid-open Publication No. 2003-109902. Referring to FIG. 16, reference numeral 69 represents a frame. The substrate structure is mounted on this frame 69, the substrate structure being constituted of a continuous oscillation laser source 60 for irradiating a laser beam having a wavelength 532 nm for inspecting (evaluating) a substrate 1 formed with a semiconductor thin film, an illumination system made of mirrors 62 and lenses 65 for irradiating a laser beam to the substrate 1 and apertures 63, and a photodetector array 67 for detecting an angular distribution of light scattered from the substrate 1. In order to add the roughness evaluation function of the embodiment, the structure for measuring a reflectance and a transmittance is added.

As the structure for measuring a reflectance and a transmittance to add the roughness evaluation function, six series of a half mirror 64, a photodetector 66 for monitoring a reflected light intensity and a photodetector 68 for monitoring a transmission light intensity, are added to the laser beam illumination optical system. A photodetector 61 for monitoring an incidence intensity of an inspection laser beam is also added. With addition of these components, a reflectance and a transmittance can be measured.

In this embodiment, the arrangement of six series of multi beams is adopted to measure the whole substrate surface in a short time. Since a laser beam irradiation intensity is about 20 mW or higher per one series, the number of series may be increased further if a high output laser source is to be used as an inspection laser source, so that the inspection time can be shortened further.

Figure 17:
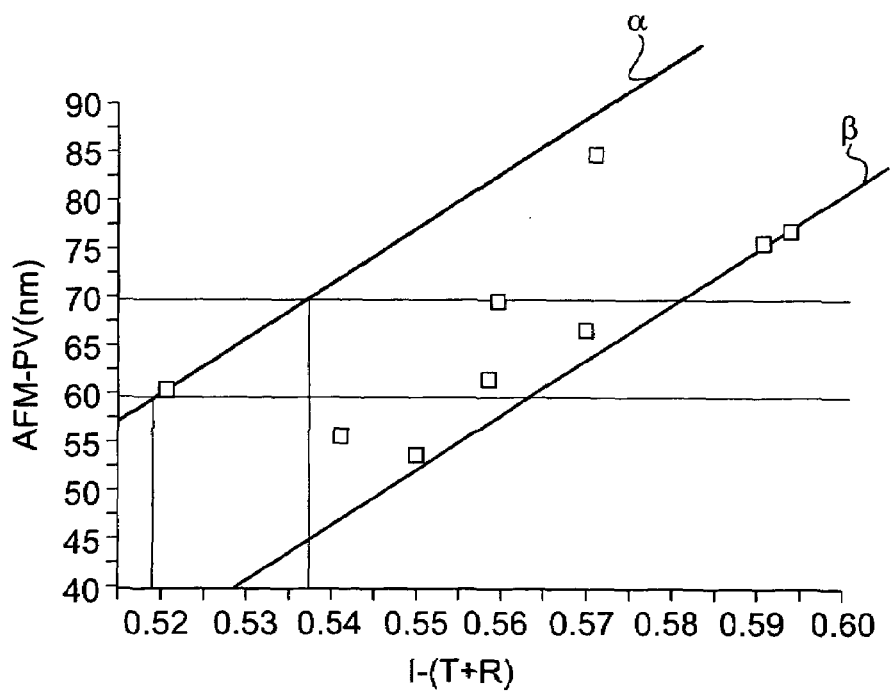
FIG. 17 is a diagram illustrating a correlation between a surface roughness measured with the grain size evaluation apparatus shown in FIG. 16 and a surface roughness evaluated with an interatomic force microscope.

FIG. 17 is a diagram illustrating the correlation between a surface roughness measured with the grain size evaluation apparatus shown in FIG. 16 and a surface roughness evaluated with an interatomic force microscope. FIG. 17 is a graph showing a comparison between the measurement results of the substrates with polycrystalline films formed under the various conditions described in the third embodiment and the PV values measured with the interatomic force microscope. The ordinate represents the PV value measured with the interatomic force microscope and the abscissa represents "1–(T+R)" where T is a transmittance and R is a reflectance. Straight lines α and β shown in FIG. 17 are correlation straight lines having the same slope and indicate the upper and lower limits of the PV values. It can be understood that there is a correlation between the PV value and "1–(T+R)".

Figure 18:
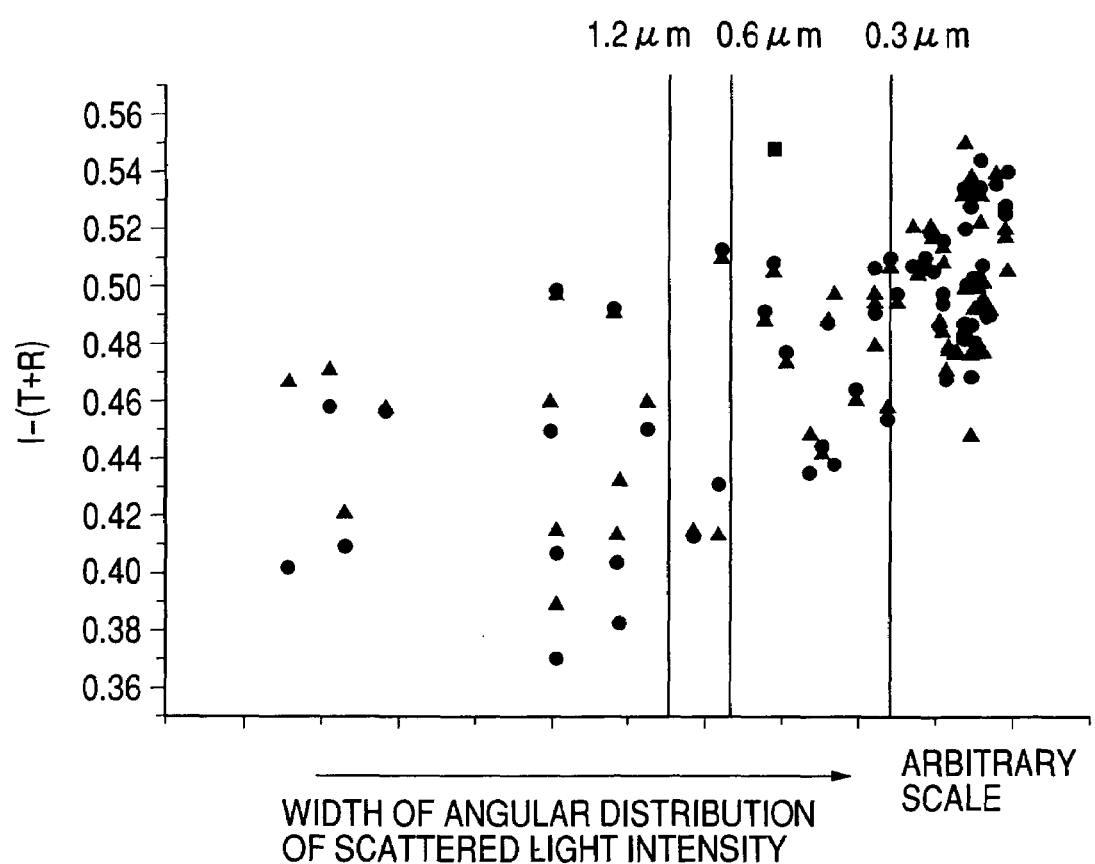
FIG. 18 is a diagram illustrating an example of the measurement results of polysilicon semiconductor thin films shown as a two dimensional distribution of grain sizes evaluated with the grain size evaluation apparatus shown in FIG. 16 and a surface roughness.

FIG. 18 is a diagram illustrating an example of the measurement results of polysilicon semiconductor thin films shown as a two dimensional distribution of a grain size evaluated with the grain size evaluation apparatus shown in FIG. 16 and a surface roughness. FIG. 18 shows an example of the evaluation results of polycrystalline films shown as a two dimensional distribution of a grain size based upon an angular distribution of scattered light measured in accordance with Japanese Patent Laid-open Publication No. 2003-109902 and "1–(T+R)". The management standards for polycrystalline films are set by using two parameters, grain size and surface roughness as shown in FIG. 17 to conduct the management of laser annealing processes. Namely, the management standard of an average grain size is set to 0.5 µm and the management standard of the average roughness is set to a PV value of 70 nm or smaller. If both the management standards are not satisfied, crystallization is repeated until the standards are satisfied. In this manner, polycrystalline films formed can satisfy both the management standards.

Sixth Embodiment

The roughness evaluation method of the fifth embodiment is applicable to the surface roughness of all polysilicon semiconductor thin films crystallized by the first, second, third and fourth embodiments. Since crystals laterally grown by the third and fourth embodiments have a regular protrusion layout, a method capable of evaluating both a protrusion layout pitch and a protrusion height will be described.

This method uses the apparatus having the structure of the fifth embodiment and a two dimensional detector as an array detector for measuring a scattered light angular distribution. A protrusion pitch is evaluated from angle information of a diffraction spot caused by a protrusion, and a protrusion height is evaluated from the spot intensity.

Figure 19A:
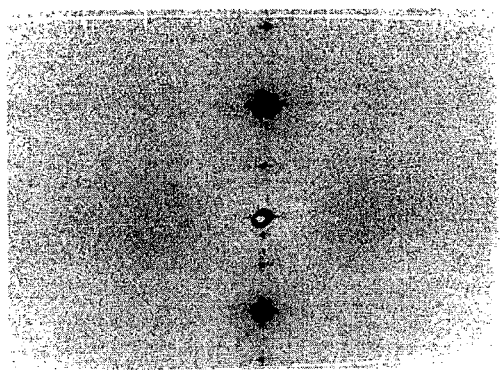
FIGS. 19A and 19B are sketches of photographs of light diffraction patterns of polysilicon semiconductor thin films formed by using a phase shift stripe pattern having a pitch of 3 μm.
Figure 19B:
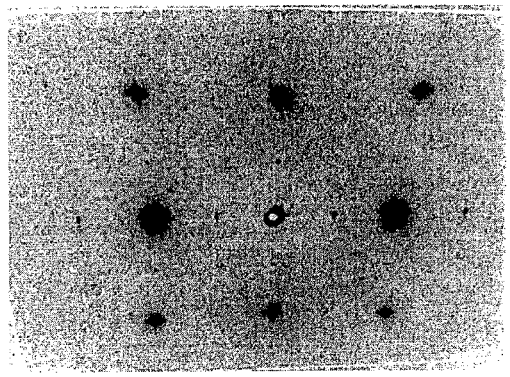

FIGS. 19A and 19B are sketches of photographs of light diffraction patterns of polysilicon semiconductor thin films formed by using a phase shift stripe pattern having a pitch of 3 µm. FIG. 19A shows a light diffraction pattern of a polysilicon semiconductor thin film formed by an annealing scan along one direction, and FIG. 19B shows a light diffraction pattern of a polysilicon semiconductor thin film formed by annealing scans along two perpendicular directions.

It can be seen from FIGS. 19A and 19B that diffraction spots caused by protrusions can be observed and the protrusion layout is dependent upon the annealing scanning direction. The intensity of the diffraction spot is dependent upon a protrusion height, the number of protrusions contained in the size of an inspection laser beam and a protrusion layout order. Since the size of the inspection laser beam is constant, the number of protrusions is constant, and if a phase shift mask having a constant pitch is used, the layout order is constant so that the light intensity of a diffraction spot is dependent upon only the protrusion height.

Figure 24:
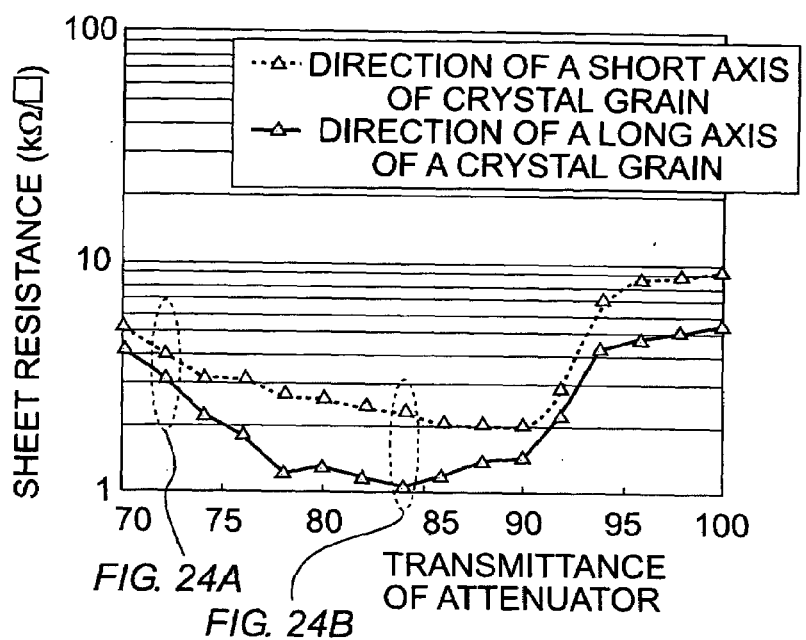
FIG. 24 illustrates the relation between a sheet resistance and a light diffraction pattern of polysilicon semiconductor thin films formed at different excimer laser beam intensities in the phase shift stripe mask method.
Figure 24A:
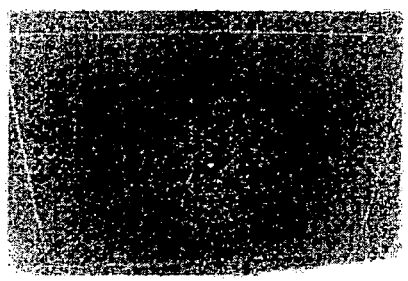
Figure 24B:
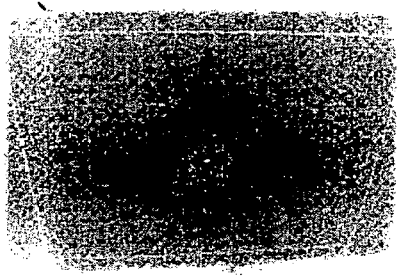

FIG. 24 illustrates the relation between a sheet resistance and a light diffraction pattern of polysilicon semiconductor thin films formed by an annealing scan along one direction at different irradiation energy densities by using a phase shift stripe pattern having a pitch of 2 μm without using the transmittance distribution filter of the third embodiment of the present invention. The abscissa represents a transmittance proportional to an irradiation laser intensity. The sheet resistance becomes small as the grain size becomes large, generally satisfying an inverse relation therebetween. As shown in FIGS. 11A and 11B, the crystal grain is elongated and the sheet resistance along the crystal long axis direction is about a half of that along the crystal short axis direction, at the transmittance of about 84%. It can be seen from the light diffraction pattern (B) that the angular distribution along the crystal long axis direction is about a half of that along the crystal short axis direction. In contrast, it can be seen that if the laser intensity is too weak at the transmittance of 72%, a ratio of the sheet resistance along the crystal grain long axis direction to that along the short axis direction is near 1 and the angular distribution width of scattered light along the long axis direction is nearly equal to that along the short axis direction. As above, the grain size can be evaluated from the angular distribution width of scattered light even for the elongated crystal grain.

Figure 20:
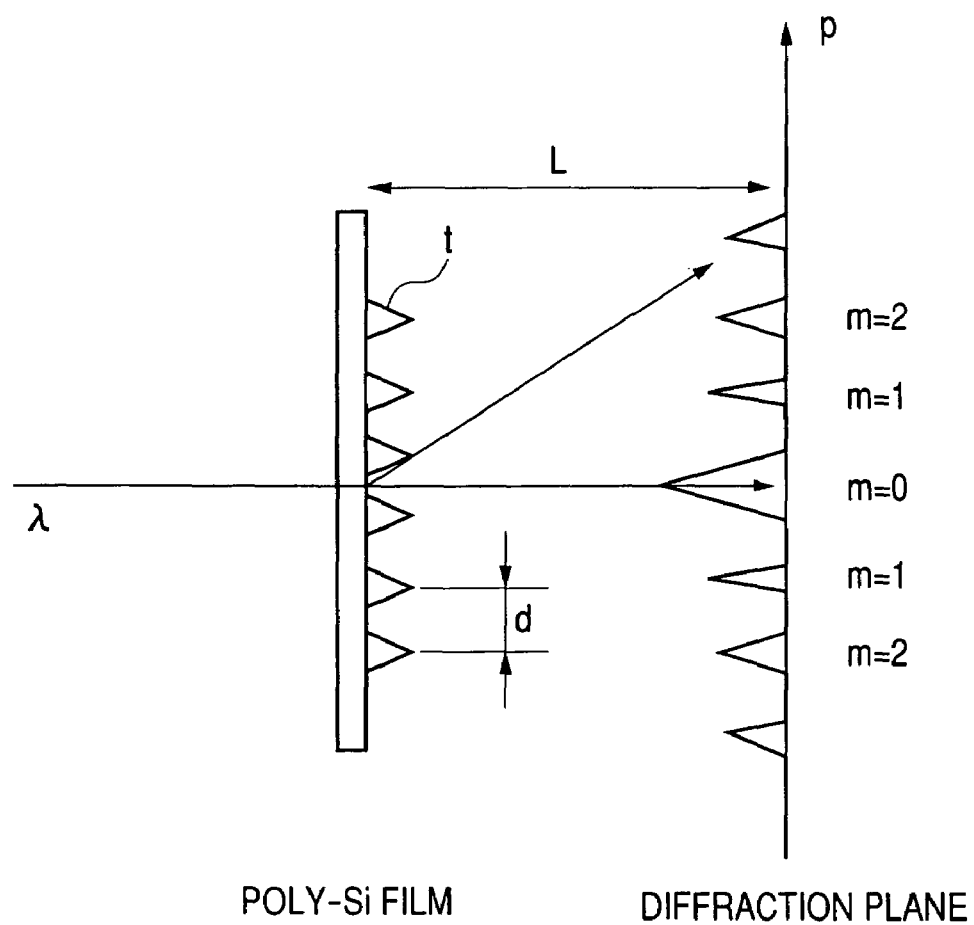
FIG. 20 is a diagram illustrating the relation between a protrusion pitch and the position of a diffraction spot on the diffraction pattern of a polysilicon semiconductor thin film formed by the third and fourth embodiments of the present invention.

FIG. 20 is a diagram illustrating the relation between a protrusion pitch and the position of a diffraction spot on the diffraction pattern of a polysilicon semiconductor thin film formed by the third and fourth embodiments of the present invention. In FIG. 20, λ represents a wavelength of a laser beam, d represents a pitch of protrusions (represented by t) formed on the polysilicon semiconductor thin film on a substrate, L represents a distance between a specimen and a diffraction pattern plane, and p is "p=L×tan(arcsin(mλ)/d". As shown in FIG. 20, the pitch d of protrusions can be evaluated from the position of the diffraction spot on the diffraction plane because the direction of forming a diffraction spot can be obtained from the function that an optical path difference between scattered light beams from respective protrusions is proportional to an integer multiplication of a wavelength. This protrusion evaluation method is also applicable to the evaluation of protrusions of a polysilicon semiconductor thin film formed by the SLS method.

In the manufacture processes for crystals whose protrusions are regularly disposed as in the phase shift stripe method and SLS method, the protrusion reduction method using the transmittance distribution filter is used, and the intensity of a light diffraction spot is measured and the management standards are applied to the measured values. If there is a part in excess of the management standards, this part is re-crystallized at a different irradiation energy until the management standards are satisfied. In this manner, it is possible to set the PV value of all protrusion heights to 70 nm or lower.

Seventh Embodiment

Next, description will be made on a thin film transistor using a polycrystalline thin film formed by each method described above and a display device having a drive circuit and a pixel circuit including thin film transistors according to the embodiment of the invention.

Figure 21:
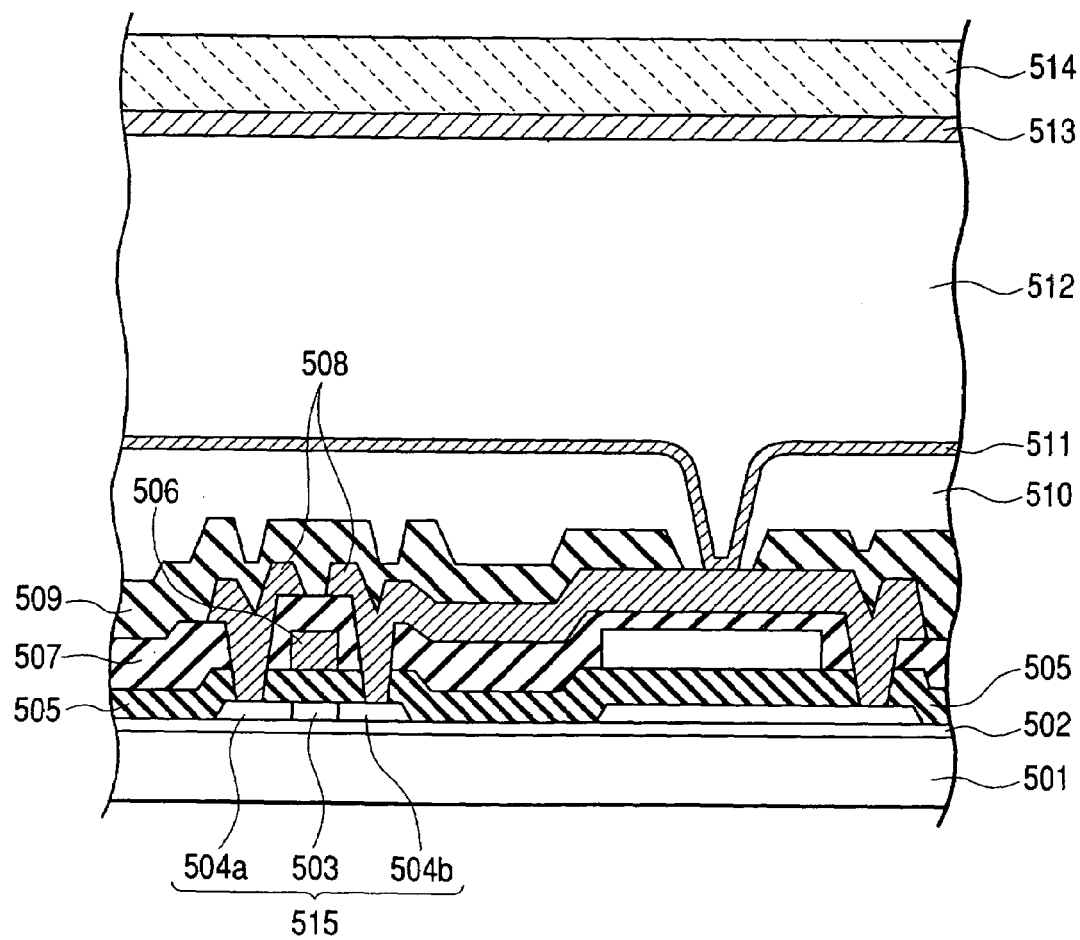
FIG. 21 is a cross sectional view showing the structure of main parts of an active matrix type liquid crystal display device as a display device including thin film transistors using polysilicon thin films formed by the manufacture method of the present invention.
Figure 22:
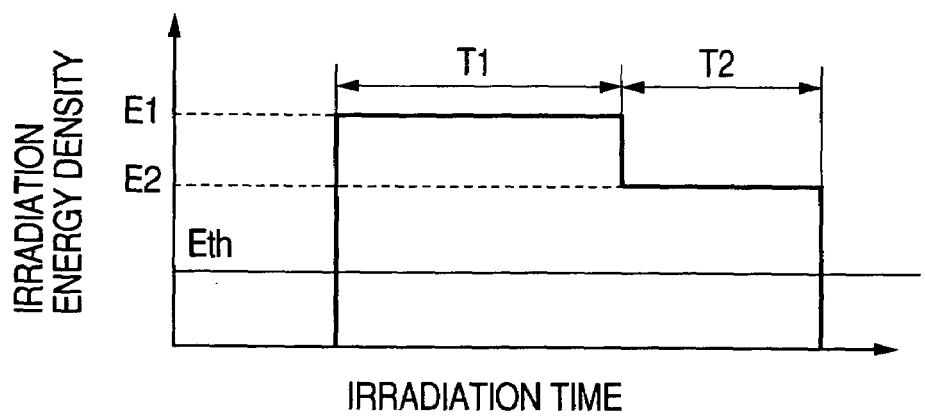
FIG. 22 is a diagram illustrating a change in a laser beam irradiation energy with time.
Figure 23:
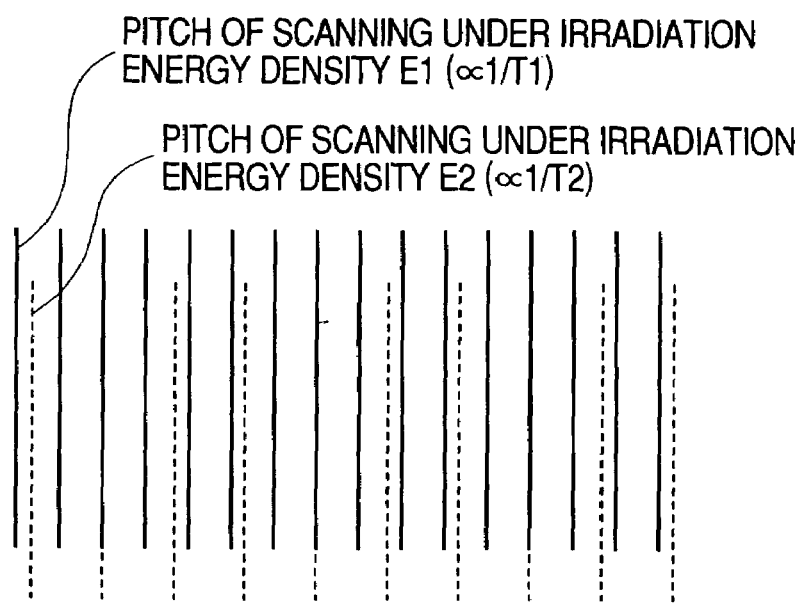
FIG. 23 is a diagram illustrating a side effect which occurs when a plurality of laser beams are scanned in accordance with a change with time shown in FIG. 22.

FIG. 21 is a cross sectional view showing the structure of main parts of an active matrix type liquid crystal display device as a display device including thin film transistors using polysilicon thin films formed by the manufacture method of the present invention. The liquid crystal display device is configured as in the following. Namely, liquid crystal 512 is hermetically filled in a space between a glass substrate 501 formed with thin film transistors 515, color filters 510 and pixel electrodes 511 and an opposing glass substrate 514 having an opposing electrode 513. An orientation film formed at the boundary between the liquid crystal 512 and each substrate is not shown and omitted in FIG. 21.

On the surface of the glass substrate 501, an undercoat layer (a silicon oxide film and a silicon nitride film) 502 is formed and an amorphous silicon semiconductor layer is formed on the undercoat layer. This amorphous silicon semiconductor layer is decomposed to a polysilicon thin film layer by laser annealing described in the embodiment of the manufacture method. A thin film transistor 515 is fabricated in the polysilicon thin film layer formed by the laser annealing. Namely, impurities are doped into opposite regions of a semiconductor layer 503 made of the polysilicon semiconductor thin film to form polysilicon source and drain semiconductor layers 504a and 504b. A gate oxide film (gate insulating layer) 505 is formed covering the semiconductor layer 503 and a gate electrode 506 is formed on the gate oxide film.

Source/drain electrodes 508 are connected to the source semiconductor layer 504a and drain semiconductor layer 504b via contact holes formed through an interlayer insulating film 507, and a protective film 509 is formed thereon. On the protective film 509, a color filter 510 and a pixel electrode 511 are formed. The laser annealing method of the present invention, particularly of the third and fourth embodiments, forms crystal grains having different sizes depending upon the direction of a single scan. Therefore, the direction of the source/drain electrodes 508 of the thin film transistor (i.e., the channel direction) 515 is aligned with the direction of a large size of the polysilicon semiconductor crystal grains. This alignment is not necessary for polysilicon semiconductor crystals annealed by two scanning directions.

This thin film transistor constitutes the pixel circuit of the liquid crystal display device, and is selected by a select signal from an unrepresented scan line drive circuit. The pixel electrode is driven by an image signal from an unrepresented signal line drive circuit. An electric field is formed between the driven pixel electrode 511 and the opposing electrode 513 on the inner surface of the opposing glass substrate 514. This electric field controls the molecule orientation direction of the liquid crystal 512 so that an image is displayed.

Thin film transistors constituting the scan line drive circuit and signal line circuit can be formed by using polysilicon semiconductor thin films similar to the pixel circuit. The present invention is applicable not only to the liquid crystal display device but also to other active matrix type display devices such as an organic EL display device and a plasma display device, other types of display devices, and the manufacture of semiconductor thin films constituting a solar cell.

As described above, by adopting the semiconductor manufacture method using the laser annealing method and its evaluation method, thin film transistors of the present invention having excellent characteristics can be massproduced. A high quality display device of the present invention can be manufactured at a very high yield by using such thin film transistors.

If an image display device is formed by forming active elements, typically thin film transistors, on an insulating substrate such as a glass substrate or when a solar cell is formed, a semiconductor substrate with a semiconductor thin film having a reduced surface roughness can be used.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor thin film decomposing method for decomposing an amorphous semiconductor thin film into a polycrystalline semiconductor thin film by irradiating a laser beam having a shape of a line beam to said amorphous semiconductor thin film by scanning said laser beam along a direction crossing a long axis direction of said line beam to conduct crystallization of said amorphous semiconductor thin film,
   wherein said crystallization is executed by transmitting said laser beam through a transmittance distribution filter for controlling a light intensity distribution in said line beam to have a constant transmittance in-plane distribution.

2. The semiconductor thin film decomposing method according to claim 1, wherein said transmittance in-plane distribution of said transmittance distribution filter has parts having different transmittances of said laser beam along a short axis direction of said line beam.

3. The semiconductor thin film decomposing method according to claim 2, wherein said transmittance in-plane distribution of said transmittance distribution filter has a distribution shape that parts having different transmittances of said laser beam are alternately distributed along the axis direction of said line beam.

4. A semiconductor thin film decomposing method of decomposing an amorphous semiconductor thin film into a polycrystalline semiconductor thin film by scanning a laser beam having a shape of a line beam and irradiating said laser beam to said amorphous semiconductor thin film to conduct crystallization of said amorphous semiconductor thin film,
   wherein said crystallization is executed by controlling a light intensity distribution in an irradiated laser beam along a direction of scanning said laser beam to have an intensity distribution having a part at an energy for melting a whole of said decomposed polycrystalline semiconductor thin film in a thickness direction and a part at an energy for melting only a surface layer of said polysilicon semiconductor thin film in the thickness direction.

5. The semiconductor thin film decomposing method according to claim 4, wherein said light intensity distribution in the irradiated laser beam is controlled by making said laser beam transmit through a transmittance distribution filter having a constant transmittance in-plane distribution and a phase shift mask.

6. The semiconductor thin film decomposing method according to claim 5, wherein said transmittance in-plane distribution of said transmittance distribution filter has parts having different transmittances of said laser beam along a short axis direction of said line beam.

7. The semiconductor thin film decomposing method according to claim 5, wherein said transmittance in-plane distribution of said transmittance distribution filter has a distribution shape that parts having different transmittances of said laser beam are alternately distributed along the axis direction of said line beam.

8. The semiconductor thin film decomposing method of decomposing an amorphous semiconductor thin film into a polycrystalline semiconductor thin film by scanning a laser beam having a shape of a line beam and irradiating said laser beam to said amorphous semiconductor thin film to conduct crystallization of said amorphous semiconductor thin film,
   wherein said crystallization is executed by controlling a light intensity distribution in an irradiated laser beam along a direction of scanning said laser beam to have an intensity distribution having a part at an energy for melting a whole of said decomposed polycrystalline semiconductor thin film in a thickness direction and a part at an energy for melting only a surface layer of said polysilicon semiconductor thin film in the thickness direction,
   wherein said light intensity distribution in the irradiated laser beam is controlled by making said laser beam transmit through a transmittance distribution filter having a constant transmittance in-plane distribution and a slit mask.

9. The semiconductor thin film decomposing method according to claim 8, wherein said transmittance distribution filter has parts having different transmittances of said laser beam along a short axis direction of said line beam.

* * * * *